(12) United States Patent
Tsukada et al.

(10) Patent No.: US 8,415,791 B2
(45) Date of Patent: Apr. 9, 2013

(54) SEMICONDUCTOR DEVICE AND FABRICATION METHOD THEREFOR

(75) Inventors: Kiyotaka Tsukada, Gifu (JP); Tetsuya Muraki, Gifu (JP); Atsunari Yamashita, Gifu (JP); Yoshitomo Tomida, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 102 days.

(21) Appl. No.: 12/952,655

(22) Filed: Nov. 23, 2010

(65) Prior Publication Data

US 2011/0121450 A1 May 26, 2011

(30) Foreign Application Priority Data

Nov. 24, 2009 (JP) ................................. 2009-266869

(51) Int. Cl.
*H01L 23/48* (2006.01)

(52) U.S. Cl.
USPC .................. 257/735; 257/785; 257/E23.011; 257/E21.506; 438/125

(58) Field of Classification Search .................. 257/735, 257/785, E23.011, E21.506; 438/125
See application file for complete search history.

(56) References Cited

U.S. PATENT DOCUMENTS

| | | | |
|---|---|---|---|
| 2006/0192253 A1* | 8/2006 | Okumura et al. | 257/378 |
| 2009/0120677 A1* | 5/2009 | Nomura et al. | 174/262 |
| 2010/0027228 A1* | 2/2010 | Tsukada et al. | 361/772 |
| 2011/0080714 A1* | 4/2011 | Tsukada et al. | 361/774 |

FOREIGN PATENT DOCUMENTS

| | | |
|---|---|---|
| JP | 2006-237429 | 9/2006 |
| JP | 2009-064908 | 3/2009 |

OTHER PUBLICATIONS

U.S. Appl. No. 12/952,720, filed Nov. 23, 2010, Tsukada, et al.

* cited by examiner

*Primary Examiner* — Trung Q Dang
(74) *Attorney, Agent, or Firm* — Oblon, Spivak, McClelland, Maier & Neustadt, L.L.P.

(57) ABSTRACT

A semiconductor device includes a support plate having a hole formed therein and a conductor formed on a wall surface of the hole, a semiconductor element; and a conductive post formed by a conductor having a first end portion at one end, and a second end portion at an other end. The second end portion of the conductive post is connected to the semiconductor element, and a side surface of the conductive post is fixed to the conductor on the wall surface of the hole deformed by pressing force of the conductive post on a side closer to the first end portion than the second end portion.

20 Claims, 21 Drawing Sheets

FIG.27

| SAMPLES | HOLES IN SUPPORT PLATE | | | |
|---|---|---|---|---|
| | SHAPES | CONDUCTIVE MATERIALS | CONDUCTOR SURFACE | CONDUCTOR THICKNESS (mm) |
| #11 | CIRCLE | COPPER PLATED >99.9% | — | 0.03 |
| #12 | CIRCLE | OXYGEN-FREE COPPER | ELECTROLESS NICKEL 5μm ELECTROLESS GOLD 0.15μm | 0.04015 |
| #13 | CIRCLE | COPPER PLATED >99.9% | — | 0.03 |
| #14 | CIRCLE | COPPER PLATED >99.9% | — | 0.03 |
| #15 | CIRCLE | COPPER PLATED >99.9% | — | 0.03 |
| #16 | CIRCLE | OXYGEN-FREE COPPER | ELECTROLESS NICKEL 5μm ELECTROLESS GOLD 0.15μm | 0.04015 |
| #17 | CIRCLE | OXYGEN-FREE COPPER | ELECTROLESS NICKEL 5μm ELECTROLESS GOLD 0.15μm | 0.04015 |
| #18 | CIRCLE | OXYGEN-FREE COPPER | ELECTROLESS NICKEL 5μm ELECTROLESS GOLD 0.15μm | 0.04015 |

FIG.28

| SAMPLES | CONDUCTOR POSTS | | | | | |
|---|---|---|---|---|---|---|
| | CONDUCTIVE MATERIALS | SURFACE | END FACE SHAPES | END FACE SIZE (mm) | POST DIAMETER (mm) | POST CROSS-SECTIONAL AREA (mm²) |
| #11 | OXYGEN-FREE COPPER | — | CIRCLE | 0.005 | 0.44 | 0.152 |
| #12 | OXYGEN-FREE COPPER | ELECTROLESS NICKEL 5μm | COSMOS SHAPE | LONG 0.03 SHORT 0.015 | 0.45 | 0.159 |
| #13 | PURE ALUMINUM 1N99 | — | CIRCLE | 0.005 | 0.438 | 0.151 |
| #14 | OXYGEN-FREE COPPER | — | CIRCLE | 0.005 | 0.433 | 0.147 |
| #15 | OXYGEN-FREE COPPER | — | CIRCLE | 0.005 | 0.44 | 0.152 |
| #16 | OXYGEN-FREE COPPER | ELECTROLESS NICKEL 5μm | COSMOS SHAPE | LONG 0.005 SHORT 0 | 0.45 | 0.159 |
| #17 | OXYGEN-FREE COPPER | ELECTROLESS NICKEL 5μm | COSMOS SHAPE | LONG 0.001 SHORT 0 | 0.45 | 0.159 |
| #18 | OXYGEN-FREE COPPER | ELECTROLESS NICKEL 5μm | COSMOS SHAPE | LONG 0.03 SHORT 0.015 | 0.45 | 0.159 |

FIG.29

| SAMPLES | FIXING PORTION | | | |
|---|---|---|---|---|
| | FITTING DEFORMATION RATIO (%) | AREA OF FIXTURE (mm²) | AREA OF FIXTURE (POST CROSS SECTION %) | AREA OF FIXTURE OF METAL FOIL (%) |
| #11 | 16.7 | 0.283 | 186 | 50 |
| #12 | LONG 66.7 SHORT 33.3 | 0.308 | 194 | 37.4 |
| #13 | 16.7 | 0.283 | 187 | 50 |
| #14 | 16.7 | 0.415 | 282 | 50 |
| #15 | 16.7 | 0.09676 | 64 | 26 |
| #16 | LONG 11.1 SHORT 0 | 0.13 | 82 | 15.1 |
| #17 | LONG 4.4 SHORT 0 | 0.06 | 38 | 7.0 |
| #18 | LONG 66.7 SHORT 33.3 | 0.308 | 194 | 37.4 |

FIG.30

| SAMPLES | 25~150°C ALLOWABLE CURRENT (A/POST) |
|---|---|
| #11 | 62 |
| #12 | 57 |
| #13 | 48 |
| #14 | 65 |
| #15 | 41 |
| #16 | 38 |
| #17 | 15 |
| #18 | 42 |

US 8,415,791 B2

SEMICONDUCTOR DEVICE AND FABRICATION METHOD THEREFOR

CROSS-REFERENCE TO RELATED APPLICATION

This application claims the benefit of Japanese Patent Application No. 2009-266869, filed on Nov. 24, 2009, the entire disclosure of which is incorporated by reference herein.

FIELD

The present invention relates generally to a semiconductor device and a fabrication method therefor.

BACKGROUND

A semiconductor device having electronic parts, such as semiconductor elements, mounted therein is required to, for example, endure the heat cycle caused by repetitive occurrence of a hot portion and a low-temperature portion, sustain electrical connection and electrical insulation, and stably support parts. Particularly, it is important that semiconductor devices which deal with high power, including a semiconductor module having a semiconductor element for power (power semiconductor element), such as an IGBT (Insulated Gate Bipolar Transistor), should endure a high heat discharge characteristic and a repetitive heat cycle. When a crack occurs at the solder or the like of the connected portion of a power semiconductor element due to the repetitive heat cycle, the heat resistance and electrical resistance increase. When the deterioration becomes greater, heat-originated breaking may progress acceleratingly, so that the performance of the device is unlikely to be exercised.

Unexamined Japanese Patent Application KOKAI Publication No. 2006-237429 discloses a semiconductor device which has an electrode member and a semiconductor element to be mounted therein using the electrode member. The electrode member includes an insulative support plate (power feeding plate) having a plurality of through holes, and a plurality of conductive posts (power feeding posts) placed in each through hole. The conductive posts are connected to the electrodes of the semiconductor element. According to the technique disclosed in Unexamined Japanese Patent Application KOKAI Publication No. 2006-237429, as the semiconductor element is connected using the electrode member which has a plurality of electrodes provided at a single electrode, thermal stress applied to the interface between the metallic post and the semiconductor element is likely to become smaller as compared with the case where a single conductive post is used for a single electrode. Even if the difference in the coefficient of thermal expansion between the metallic post and the semiconductor element is large, therefore, the reliability of connection of the semiconductor element can be enhanced.

Unexamined Japanese Patent Application KOKAI Publication No. 2009-64908 discloses a semiconductor device which has a support plate (power feeding plate) including, for example, a glass epoxy resin substrate, and columnar conductive posts (power feeding posts). The technique disclosed in Unexamined Japanese Patent Application KOKAI Publication No. 2009-64908 improves the reliability of the electrical conductivity and the heat cycle durability relating to the heat conductivity.

The disclosures of Unexamined Japanese Patent Application KOKAI Publication No. 2006-237429 and Unexamined Japanese Patent Application KOKAI Publication No. 2009-64908 are incorporated by reference herein.

SUMMARY

A semiconductor device according to a first aspect of the invention includes a support plate having a hole formed therein and a conductor formed on a wall surface of the hole, a semiconductor element, and a conductive post formed by a columnar conductor having a first end portion at one end, and a second end portion at an other end, the second end portion of the conductive post being connected to the semiconductor element, a side surface of the conductive post being fixed to the conductor on the wall surface of the hole deformed by pressing force of the conductive post on a side closer to the first end portion than the second end portion.

A fabrication method for a semiconductor device according to a second aspect of the invention includes forming a hole in a support plate, forming a conductor on a wall surface of the hole, fitting the conductive post in the hole, and fixing a first end portion of the conductive post to the conductor on the wall surface of the hole, and connecting a second end portion of the conductive post, which is on an opposite side to the first end portion, to the semiconductor element.

BRIEF DESCRIPTION OF THE DRAWINGS

A more complete understanding of this application can be obtained when the following detailed description is considered in conjunction with the following drawings, in which:

FIG. 27 is a table showing the shapes, etc. of holes, conductors on the wall surfaces thereof in Examples 1 to 8;

FIG. 28 is a table showing the materials, etc. of conductive posts in the Examples 1 to 8;

FIG. 29 is a table showing areas of fixture (fitting areas), etc. in the Examples 1 to 8; and FIG. 30 is a table showing the results of measuring allowable currents in the Examples 1 to 8.

DETAILED DESCRIPTION

Figure 1:
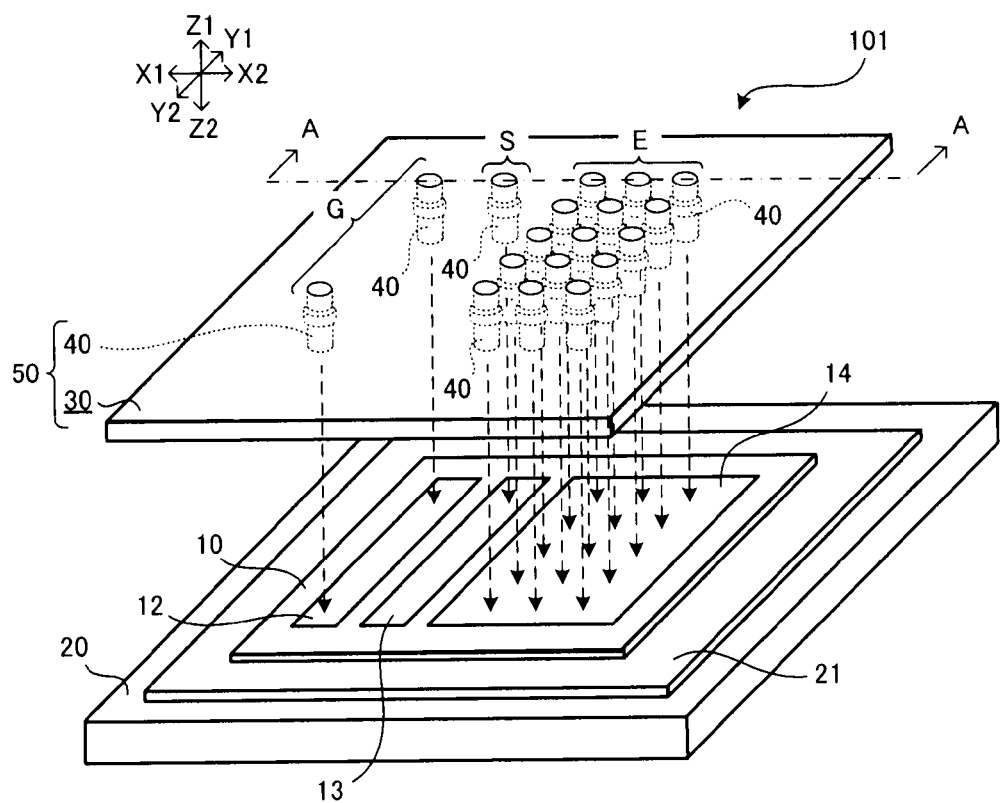
FIG. 1 is a diagram showing a semiconductor device according to an embodiment of the invention.

The IGBT module needs to meet the requirement that a large current should flow to the conductive posts. The larger the current allowed to flow (hereinafter called "allowable current"), the higher the performance of the module. However, a large current flowing to the conductive posts heats up the connected portions of the conductive posts and the support plate (wiring board), which may result in breaking (disconnection) of the connected portions when the heating-originated deterioration gets greater. This seems to occur due to the connection of the conductive posts with the support plate by a material with a lower melting point than those of the conductive posts, the electrodes of the support plate, or the like (hereinafter called "low-melting point material"), such as solder or silver solder. That is, the conductive posts and the support plate are often connected by melting the low-melting point material, and then hardening it again. Generally, the resistance of the low-melting point material used in such connection is comparatively high, so that when a large current flows to the conductive posts, the low-melting point material generates heat quicker than the conductive posts, the electrodes of the support plate or the like. The heat generation, when occurred, further increases the electrical resistance, so that the temperature is likely to rise acceleratingly. It seems that the increased temperature causes the low-melting point material to melt again, making it easier for the connected portions to break.

In light of the above situation, the allowable current of an IGBT module is generally approximately 10 amp or less per module. There are some studies made to increase the number of the conductive posts and the number of the electrodes of the support plate in order to make the allowable current larger. However, such approaches are disadvantageous in terms of cost or the like.

Recently, power devices which, for their smaller sizes, can endure the flow of a larger current have been developed, which leads to a greater amount of heat generation. IGBT device materials have been studied, so that SiC (Silicon Carbide)-based devices have been developed in addition to the conventional Si (Silicon)-based devices, and devices whose maximum allowable temperatures reach about 250° C. to about 350° C. in comparison to the conventional maximum allowable temperature of about 150° C. to about 180° C. are appearing.

In a semiconductor device using such a power device, the power device itself can endure the flow of a larger current and can operate at a high temperature. If the allowable current at the interfaces between the metallic posts and the electrodes of the support plate is small, however, the power device cannot demonstrate its performance adequately.

The present invention can provide a semiconductor device with a large allowable current, and a fabrication method therefor.

A preferred embodiment of the present invention will be described below with reference to the accompanying drawings. In the diagrams, arrows Z1 and Z2 respectively indicate directions of lamination of a wiring board which are equivalent to normal directions of the major surfaces (top and bottom surfaces) of the wiring board (i.e., thicknesswise directions of a heat discharge plate). Arrows X1, X2, Y1 and Y2 indicate directions orthogonal to the laminating directions (directions parallel to the major surfaces of the wiring board). The major surfaces of the wiring board are X-Y planes. The side surfaces of the wiring board are an X-Z plane or a Y-Z plane.

According to the embodiment, the two major surfaces facing opposite normal directions are respectively referred to as "first surface" (surface on the arrow Z1 side), and "second surface" (surface on the arrow Z2 side).

The axis of a conductive post is a line parallel to the direction of insertion of the conductive post and passing the center of gravity (the center in the case of a circle) of each cross section of the conductive post. According to the embodiment, the Z direction as the inserting direction is equivalent to the axial direction. A cross section orthogonal to the axial direction (X-Y plane) is referred to as "horizontal cross section". A cross section parallel to the axial direction (X-Z plane or Y-Z plane) is referred to as "vertical cross section".

In addition, a layer including a conductive pattern which functions as wirings of a circuit or the like is referred to as "wiring layer". A conductive film which is formed on the wall surface of a through hole is referred to as "through hole conductor". A wiring layer may include lands of a through hole conductor or the like in addition to the conductive pattern. "Holes" include a non-through hole in addition to a through hole conductor. With regard to a non-through hole, the "wall" of the hole includes a bottom surface in addition to a side surface. The "width" of a hole or a columnar portion (projection) means the diameter when it is a circle, or means $\sqrt{(4 \times \text{sectional area}/\pi)}$ when it is not a circle, unless otherwise specified. When a conductor or the like is formed on the wall surface of a hole, the width of the hole is narrower by its thickness unless otherwise specified. When holes or columnar portions (projections) are tapered, it is possible to determine whether the "widths" of two or more holes or projections coincide with each other or not by comparing the values of corresponding portions, the average values thereof, the maximum values thereof, or the like. "Insertion" includes fitting or threading of a member sufficiently narrower than the diameter of a hole into the hole in addition to inserting the member into the hole.

Figure 2:
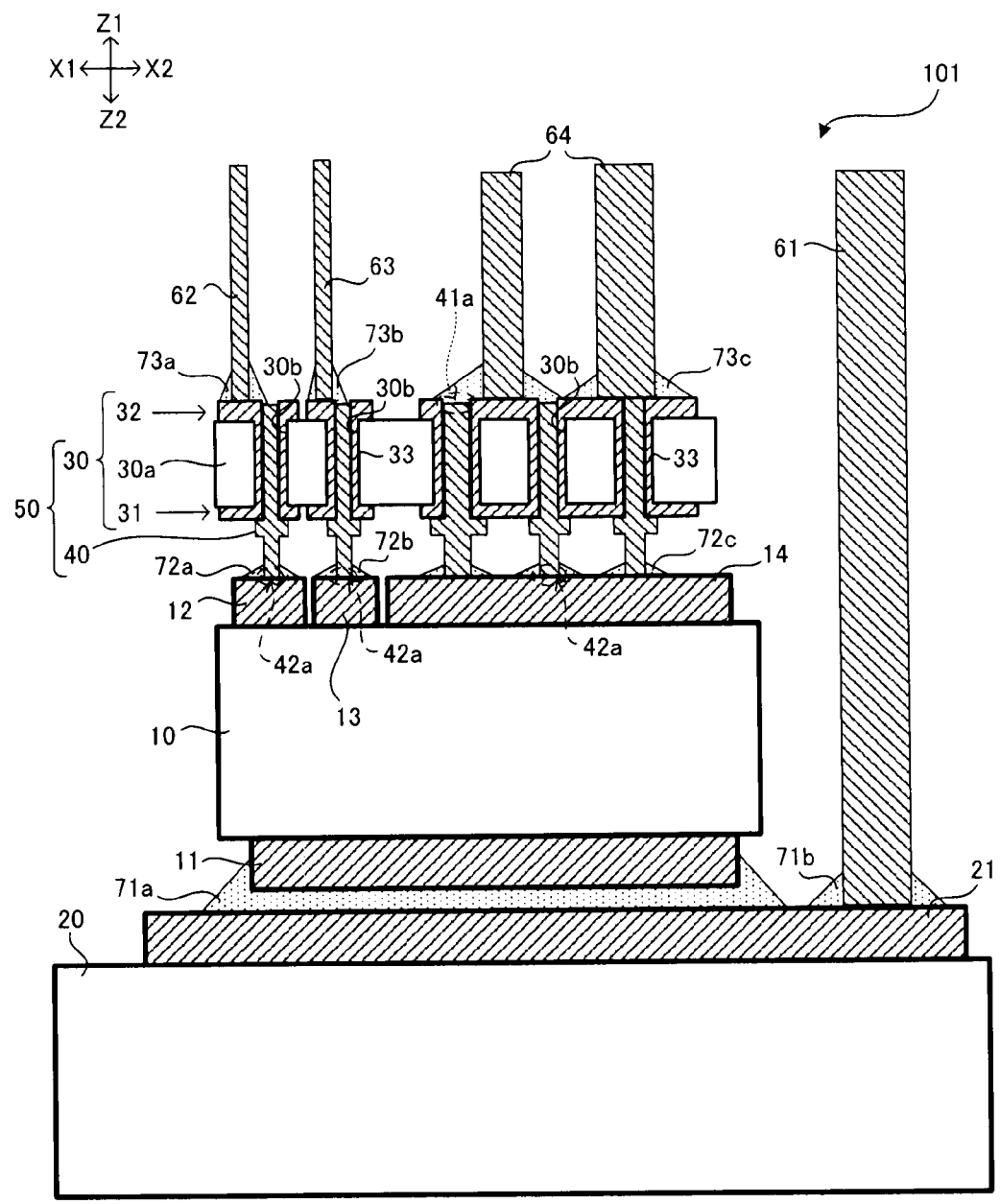
FIG. 2 is a cross-sectional view along line A-A in FIG. 1.

FIGS. 1 and 2 show a semiconductor device 101 according to the embodiment. FIG. 1 is an exploded view of the semiconductor device 101. For the sake of descriptive convenience, some components are not illustrated in FIG. 1. FIG. 2 is a cross-sectional view along line A-A in FIG. 1.

The semiconductor device 101 includes a semiconductor element 10, a heat discharge plate 20, a connecting board 50, and external connection terminals 61 to 64. The connecting board 50 has a support plate 30 and conductive posts 40.

The semiconductor element 10 is formed by, for example, an IGBT element, which is not restrictive. For example, the semiconductor element 10 may be another power semiconductor element, such as GTO (Gate Turn OFF thyristor) which is used in a switching power supply, an inverter or the like. The type of the semiconductor element 10 is not limited to a power semiconductor element, and is optional.

The heat discharge plate 20 is formed by, for example, an insulative ceramic plate, a heat-resistant resin, or an insulated metal plate. The material for the heat discharge plate 20 is not limited to those materials, and is optional.

An electrode 11 is provided on a second surface (bottom surface) of the semiconductor element 10. The electrode 11 is, for example, a collector electrode. Electrodes 12, 13 and 14 are provided on a first surface (top surface) of the semiconductor element 10. The electrode 12 is, for example, a gate electrode, the electrode 13 is, for example, the electrode of each of various sensors, and the electrode 14 is, for example, an emitter electrode.

A conductive electrode 21 (conductive layer) is formed on a first surface (support-plate side major surface) of the heat discharge plate 20. The electrode 21 is electrically connected to the electrode 11 via a conductive material 71a. As a result, the semiconductor element 10 is fixed to the heat discharge plate 20. The conductive material 71a is a wax material, such as solder or silver solder, or a conductive paste, for example. The conductive material 71a changes its property (e.g., it is hardened) due to, for example, the temperature, pressure or the like. The electrodes 11 and 21 can be adhered together by using such a property change. Hereinafter, a portion which is connected by the conductive material 71a is referred to as "first connection portion".

The support plate 30 is a wiring board including an insulating substrate 30a, conductor circuits 31, 32, and a conductor 33 (through hole conductor). The conductor circuit 31 is formed on a second surface (bottom surface) of the insulating substrate 30a, and the conductor circuit 32 is formed on a first surface (top surface) of the insulating substrate 30a. A plurality of holes 30b (whose number corresponds to the number of the conductive posts 40) are formed in the support plate 30. The hole 30b is, for example, a through hole. The conductor 33 is formed on the wall surface of the hole 30b. The hole 30b may be a bottomed hole (see FIG. 11 to be described later). The conductor circuits 31, 32, and the conductor 33 are formed of copper, for example. Copper is widely used for patchboards, and is easily available. It is to be noted however that the material is not limited to copper, and can be any conductive material.

The conductive posts 40 are columnar conductors made of a metal, such as copper. The conductive posts 40 are classified into gate posts G which are connected to the electrode 12 (gate electrode), sensor posts S which are connected to the electrode 13 (sensor electrode), and emitter posts E which are connected to the electrode 14 (emitter electrode). The gate posts G include, for example, two conductive posts 40, the sensor posts S include, for example, one conductive post 40, and the emitter posts E include, for example, fifteen (3×5) conductive post 40.

Figure 3:
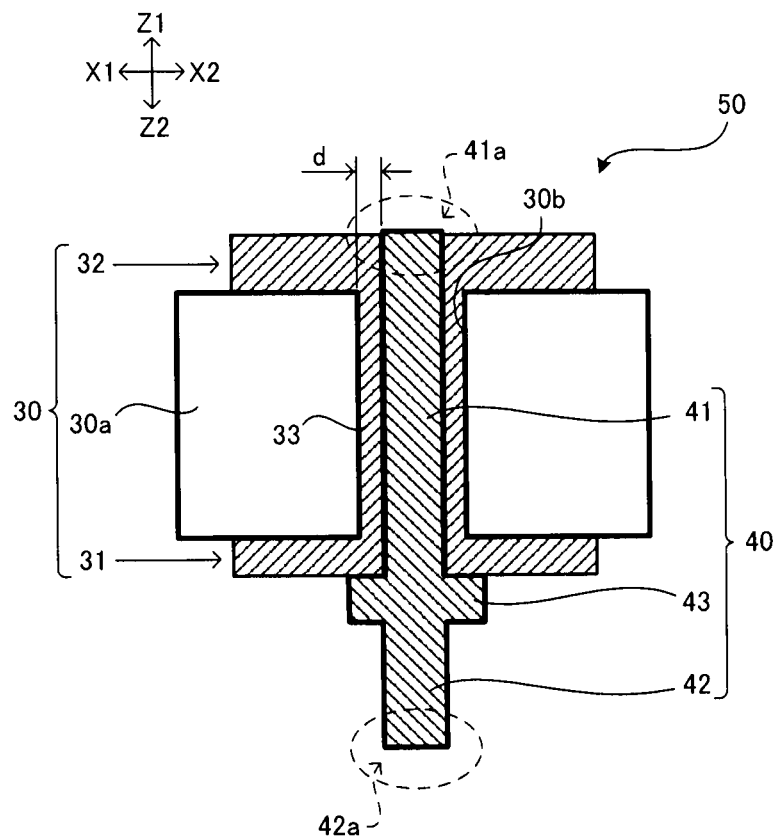
FIG. 3 is a cross-sectional view showing the connection structure for a conductive post and a support plate according to the embodiment of the invention.
Figure 4:
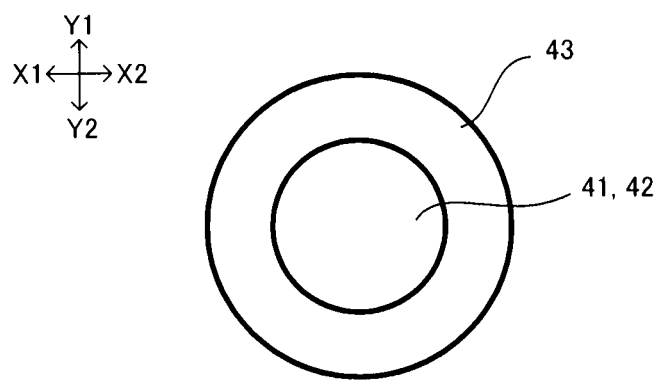
FIG. 4 is a plan view showing the structure of the conductive post according to the embodiment of the invention.

Each of the conductive posts 40 included in the gate posts G, the sensor posts S and the emitter posts E has a first column portion 41, a second column portion 42, and a collar portion 43 as shown in FIG. 3 (cross-sectional view) and FIG. 4 (plan view). The collar portion 43 serves as a stopper. That is, the collar portion 43 prevents excessive insertion of the conductive post 40 into the hole 30b.

The conductive post 40 has a first end portion 41a at one end, and a second end portion 42a at the other end. The first end portion 41a is an end portion of the first column portion 41 on the side of the arrow Z1, and the second end portion 42a is an end portion of the second column portion 42 on the side of the arrow Z2 (end portion opposite to the first end portion 41a). Each of the first column portion 41, the second column portion 42 and the collar portion 43 is cylindrical. The end face shape of the first end portion 41a and the opening shape of the hole 30b are both circles which are analogous (see FIG. 7 to be described later). However, the shapes are not limited to a circle, and are optional (see FIGS. 13A to 20 to be described later).

A part (first column portion 41) of the conductive post 40 is inserted into the hole 30b from the first end portion 41a side. The second end portions 42a of the conductive posts 40 are respectively connected to the electrodes 12, 13 and 14.

Figure 5:
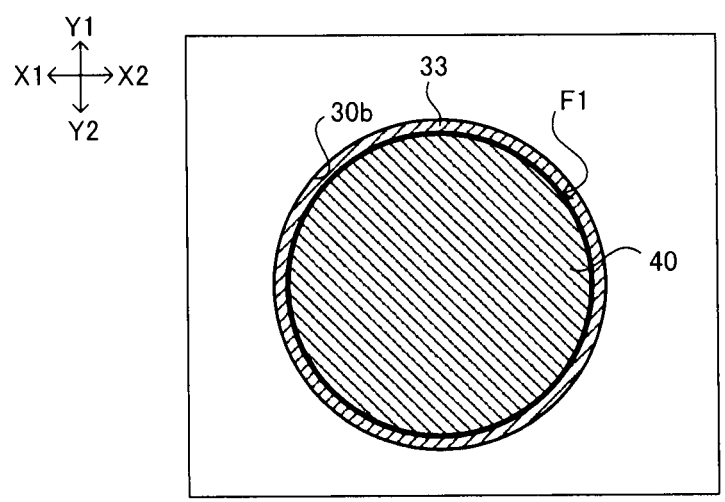
FIG. 5 is a cross-sectional view showing the connection structure for the conductive post and the wall surface of a hole in the support plate according to the embodiment of the invention.

FIG. 5 is a cross-sectional view (X-Y plane) showing the connection portion where the conductive post 40 and the wall surface of the hole 30b are connected together. As shown in FIG. 5, the side surface of the conductive post 40 is fixed to the conductor 33 on a side closer to the first end portion 41a than the second end portion 42a. Further, the conductor 33 is deformed by pressing force of the conductive post 40 (fitting-originated pressure). That is, the conductive post 40 and the conductor 33 are directly fixed together. This can eliminate a material which melts at a low temperature, such as solder or silver solder, from the interface, making it easier to improve the conductivity. Since the conductor 33 is fixed with at least a part of the conductive post 40 being deformed by mechanical force at the fitting surface (fixture surface), it is possible to eliminate an inhibiting material (oxygen or the like) which is present at the surface of the conductive post 40, the wall surface of the hole 30b, or the like, thereby making it easier to improve the conductivity.

In addition, the analogous relation between the end face shape of the first end portion 41a and the opening shape of the hole 30b allows a fixture surface F1 (fitting surface) to be formed on substantially the entire perimeter of the conductive post 40. This improves the connection strength.

The area of contact (area of fixture) between the conductive post 40 and the wall surface (conductor 33) of the hole 30b is preferably at least about 50% of the area of the horizontal cross section of the conductive post 40 or greater. With the contact area being 50% of the area of the horizontal cross section or greater, local heat generation is not easily caused by an increase in electrical resistance, making it difficult to accelerate oxidization, which makes it difficult for the electrical resistance to increase.

As shown in previously referred FIG. 3, the side surface of the conductive post 40 is in contact with the conductor circuits 31 and 32. This makes the movement of the heat from the conductive post 40 the conductor circuits 31 and 32 smoother, and causes the current to flow smoothly. This effect is prominent when the contact area (in total) between the conductive post 40 and the conductor circuits 31 and 32 is equal to or greater than about 15% of the area of the horizontal cross section of the conductive post 40, and becomes more prominent when the contact area is equal to or greater than about 25% of the area of the horizontal cross section. It is therefore preferable that the contact area should be set within such ranges.

The electrodes 12, 13 and 14 are electrically connected to the second end portions 42a of the conductive posts 40 via conductive materials 72a to 72c respectively. Each of the conductive materials 72a to 72c is a wax material, such as solder or silver solder, or a conductive paste, for example. The conductive materials 72a to 72c, like the conductive material 71a, are adhesive. Hereinafter, a portion which is connected by each of the conductive materials 72a to 72c is referred to as "second connection portion".

The external connection terminal 61 is connected to the electrode 21, and the external connection terminals 62 to 64 are connected to the conductor circuit 32. The external connection terminal 61 and the electrode 21 are electrically connected together via a conductive material 71b. The external connection terminals 62, 63 and 64 are electrically connected to the conductor circuit 32 via conductive materials 73a, 73b and 73c, respectively. As a result, the pair of the external connection terminal 62 and the electrode 12 are electrically connected together, the pair of the external connection terminal 63 and the electrode 13 are electrically connected together, and the pair of the external connection terminal 64 and the electrode 14 are electrically connected together. Each of the conductive materials 71b, and 73a to 73c is a wax material, such as solder or silver solder, or a conductive paste, for example. The conductive materials 71b, and 73a to 73c, like the conductive material 71a or the like, are adhesive.

It is effectively to use a metal or an alloy which mainly contains copper, aluminum, silver or gold, for example, as the material for the conductive post 40. Of those materials, a metal or an alloy which mainly contains copper or aluminum is particularly effective. In addition, alloys of copper or aluminum whose electrical resistance exceeds 50% of that of copper, or the like are effective too. Those materials are easily deformed against mechanical stress, and are therefore likely to form a fixture surface. Because those materials have small changes in electrical resistance against an increase in temperature, they are likely to keep a low electrical resistance even when the temperature rises.

Figure 6:
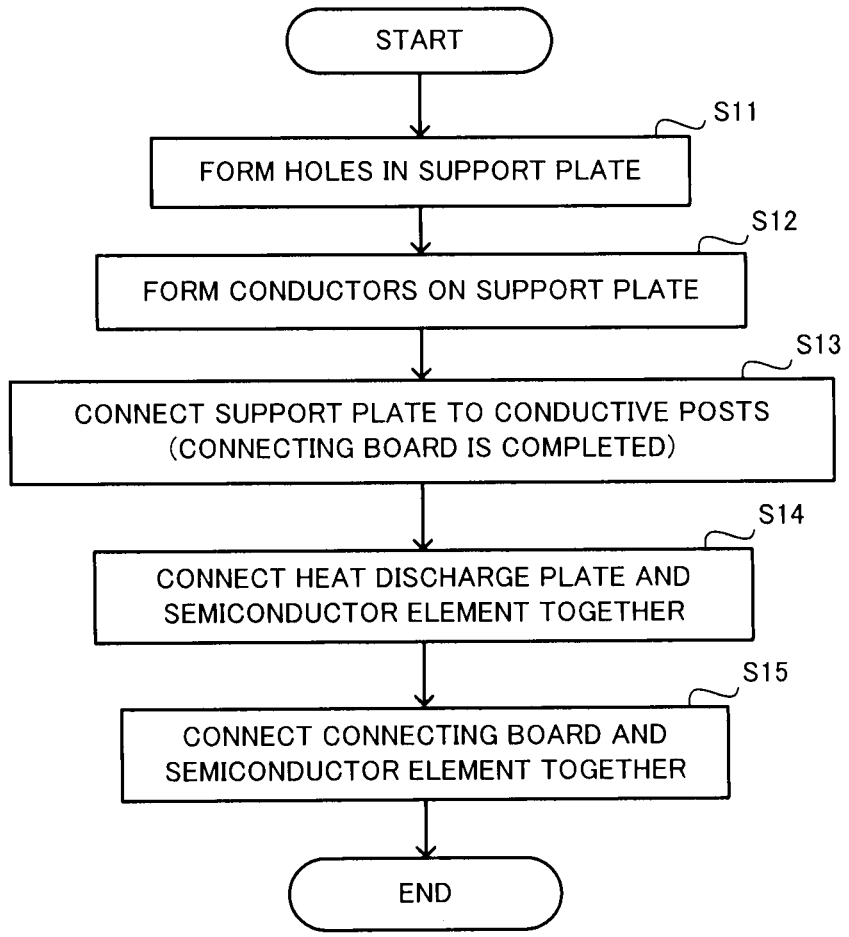
FIG. 6 is a flowchart illustrating the contents and procedures of a fabrication method for the semiconductor device according to the embodiment of the invention.

The semiconductor device 101 is fabricated, for example, in procedures as shown in FIG. 6.

In step S11, the holes 30b are formed in the positions of the insulating substrate 30a where the conductive posts 40 are to be mounted. The holes 30b can be formed by, for example, a drill or laser.

In subsequent step S12, a conductor is formed on the insulating substrate 30a. That is, conductive layers are formed on both sides of the insulating substrate 30a, and the conductor 33 is formed on the wall surface of the hole 30b. Then, the conductive layers on both sides are patterned to be the conductor circuits 31, 32. The timing for the patterning can be before or after step S13. The method of forming the conductive layers is optional. For example, a metal foil (such as a copper foil) prepared separately may be adhered to the insulating substrate 30a. Alternatively, the conductive layers and the conductor 33 may be formed by performing plating after, for example, on electroless plating, sputtering, vapor deposition or the like. When the conductor is formed on the wall surface of the hole 30b, plating is preferable. Plating can allow the conductor to be easily formed on the wall surface of the hole 30b.

In subsequent step S13, the conductive posts 40 are fitted into the holes 30b from the first end portion 41a side, thereby completing the connecting board 50.

Figure 7:
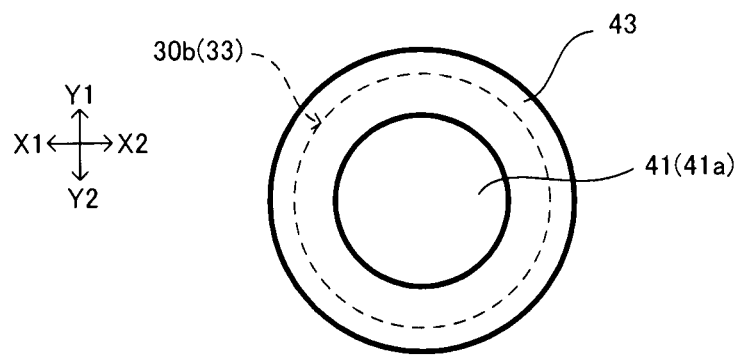
FIG. 7 is a diagram showing the relationship between the shape of the end face of a first end portion and the opening shape of the hole according to the embodiment of the invention.

As shown in FIG. 7, the end face shape of the first end portion 41a and the opening shape of the hole 30b are analogous. Then, before insertion (fitting) of the conductive posts 40 into the holes 30b, the width (diameter) of the first end portion 41a on the insertion side is greater than the width (diameter after the formation of the conductor 33) of the corresponding portion of the hole 30b. Accordingly, the wall surface of the hole 30b (more specifically, conductor 33) is deformed by the pressing force from the conductive post 40 as the conductive post 40 is fitted into the hole 30b. The width (diameter) of the first end portion 41a before the insertion should be greater than the width of the corresponding portion of the hole 30b preferably by about 1% to about 75% of the thickness of the conductor 33 (d in FIG. 3), and more preferably by about 1% to about 50% of the thickness of the conductor 33 in case of analogous shapes. If the size is equal to or greater than about 1%, the difference between the size of the conductive post 40 and the size of the hole 30b becomes larger, making it easier to secure the amount of deformation of the conductive post 40. In addition, as it becomes easy to secure a sufficient area of fixture, a corrosive material, such as oxygen, is not easily included in the fixed portion. If the size is equal to or less than about 75%, on the other hand, it is difficult to mechanically damage the conductive layer (conductor 33) formed on the wall surface of the hole 30b, making it easier for the conductive layer to serve as the connection pin intended. In this respect, the aforementioned range of about 1% to about 75% is preferable.

In case of analogous shapes, the entire perimeter of the conductive post 40 is connected (fixed) to the hole 30b. This is favorable in terms of enhancing the connection strength, but if the width of the first end portion 41a is set greater than 50%, the conductive layer (conductor 33) formed on the wall surface of the hole 30b may be damaged mechanically or by thermal stress. In this respect, the aforementioned range of about 1% to about 50% is preferable in case of analogous shapes.

In case of fabricating the conductive post 40 which mainly contains copper or aluminum, it is preferable to perform a heat treatment involving heating and cooling, such as annealing, beforehand or at the fabrication stage.

In subsequent step S14, the semiconductor element 10 is mounted on (connected to) the heat discharge plate 20.

In subsequent step S15, the semiconductor element 10 is mounted on (connected to) the connecting board 50.

Thereafter, the external connection terminals 61 to 64 are connected to complete the semiconductor device 101. The details of the steps S11 to S15 will be given in the later description of Examples 1 and 2. The order of those steps can be changed as needed.

The invention is not limited to the foregoing embodiment. For example, the invention may be modified in the following forms.

Figure 8:
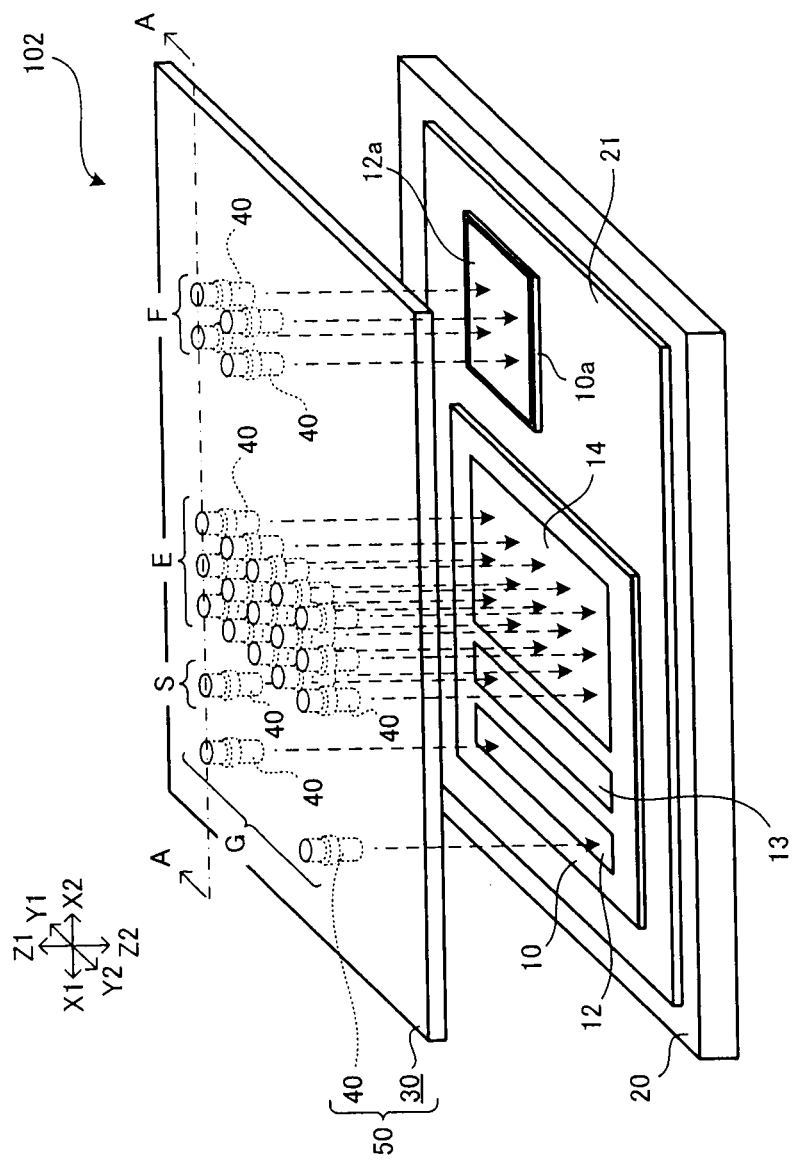
FIG. 8 is a diagram showing one example of a semiconductor device which includes an IGBT element and FWD element according to the embodiment of the invention.
Figure 9:
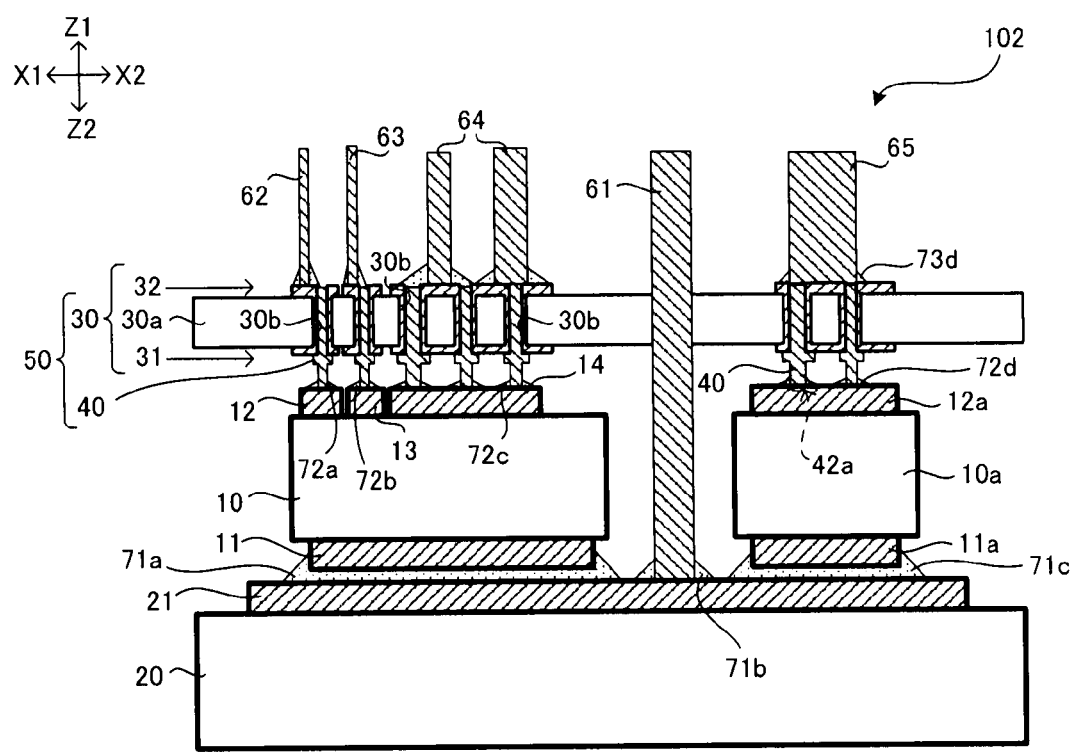
FIG. 9 is a cross-sectional view along line A-A in FIG. 8.

A plurality of semiconductor elements may be used. In addition, a plurality of semiconductor elements of different kinds may be used. For example, a semiconductor element 10a formed by an FWD element may be provided in addition to the semiconductor element 10 formed by an IGBT element as in a semiconductor device 102 shown in FIG. 8 (corresponding to FIG. 1) and FIG. 9 (corresponding to FIG. 2). The semiconductor element 10a is mounted in parallel between the emitter and collector of the semiconductor element 10, for example. The semiconductor element 10a has an electrode 11a on the second surface (bottom surface) and an electrode 12a on the first surface (top surface).

In this case, the conductive posts 40 are classified into FWD posts F to be connected to the electrode 12a (FWD electrode) in addition to the gate posts G, the sensor posts S and the emitter posts E. The FWD posts F include, for example, four (2×2) conductive posts 40. The electrode 11a is electrically connected to the electrode 21 via the conductive material 71c. The portion which is connected by the conductive material 71c is also included in the aforementioned first connection portion. The electrode 12a is electrically connected to the second end portion 42a of the conductive post 40 via a the conductive material 72d. The portion which is connected by the conductive material 72d is also included in the aforementioned second connection portion. An external connection terminal 65 is electrically connected to the conductor circuit 32 via a conductive material 73d. As a result, the external connection terminal 65 and the electrode 12a are electrically connected together. Each of the conductive materials 71c, 72d and 73d is a wax material, such as solder or silver solder, or a conductive paste, for example. The conductive materials 71c, 72d and 73d, like the conductive material 71a or the like, are adhesive.

This arrangement of the FWD element in parallel to the IGBT element can facilitate suppression of nose (reverse current) which is produced by switching of the IGBT element.

Figure 10:
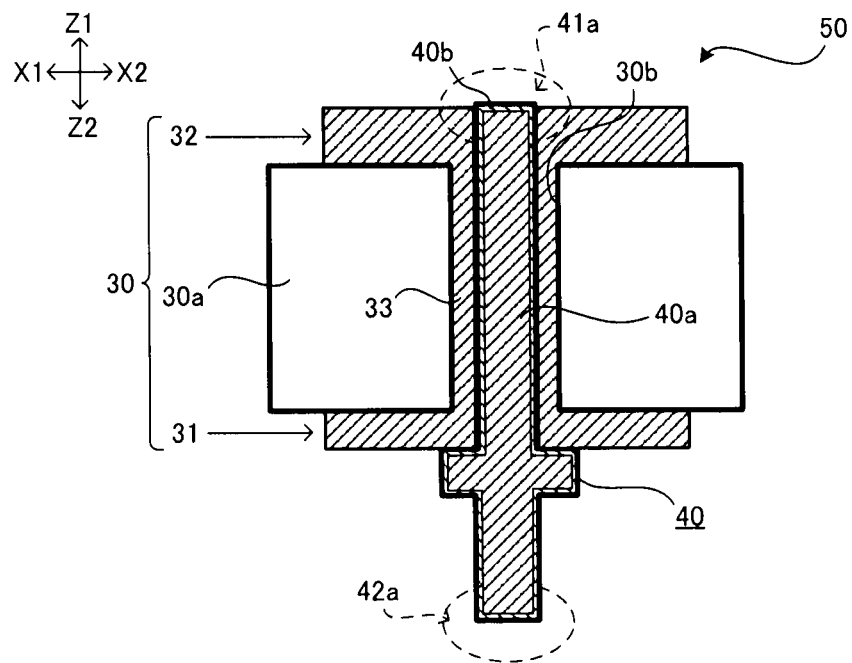
FIG. 10 is a diagram showing one example of a coated conductive post according to the embodiment of the invention.

The conductive post 40 may be coated in consideration of the influence of the general hardness. As shown in FIG. 10, for example, the conductive post 40 may include a columnar conductor 40a and a coating film 40b with high hardness coated thereon. A material having a main component of copper, silver, gold or aluminum is effective as the material for the columnar conductor 40a. An effective material for the coating film 40b is chromium, nickel, palladium, titanium or platinum. Those materials are insusceptible to a corrosive material, such as oxygen, and can suppress a change in resistance at the connection interface even if heat is generated. It is preferable that the thickness of the coating film 40b should be about 0.5 to about 10 μm. If the thickness of the coating film 40b is equal to or greater than about 0.5 μm, it is easy to secure the resistance to oxidation or corrosion. If the thickness of the coating film 40b is equal to or less than about 10 μm, on the other hand, the aforementioned metals, which are comparatively hard, does not easily inhibit deformation of the columnar conductor 40a. In this respect, the aforementioned range of about 0.5 to about 10 μm is favorable. The coating film 40b may be coated by plating, sputtering or the like after the columnar conductor 40a is fitted (fixed) into the hole 30b.

Figure 11:
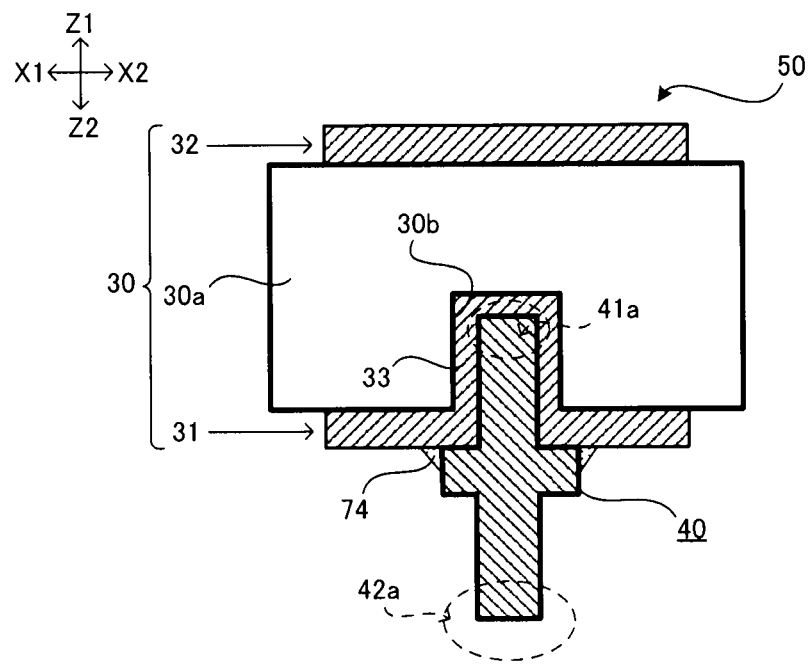
FIG. 11 is a diagram showing an example where a conductive post is inserted in a bottomed hole according to the embodiment of the invention.

As shown in FIG. 11, the hole 30b may be a bottomed hole. The conductor 33 may be formed on the entire wall surface of the hole 30b, or may be formed only on the side surface of the hole 30b.

Figure 12:
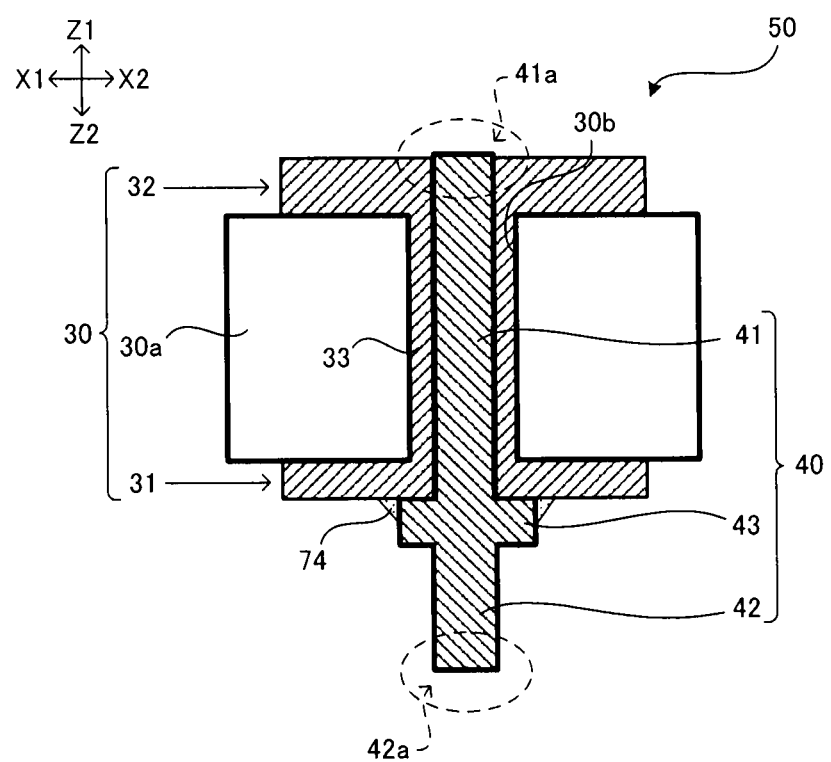
FIG. 12 is a diagram showing an example where a conductive material for connecting a conductive post is provided on a second surface side of the support plate according to the embodiment of the invention.

As shown in FIG. 12, a conductive material 74 may be provided on the second surface of the support plate 30 to enhance the strength of connection of the support plate 30 and the conductive post 40. The conductive material 74 is a wax material, such as solder or silver solder, or a conductive paste, for example. The conductive material 74, like the conductive material 71a or the like, are adhesive.

Figure 13A:
FIG. 13A is a diagram showing a regular tetragon as another example of the shape of the conductive post according to the embodiment of the invention.
Figure 13B:
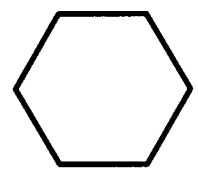
FIG. 13B is a diagram showing a regular hexagon as a different example of the shape of the conductive post according to the embodiment of the invention.
Figure 13C:
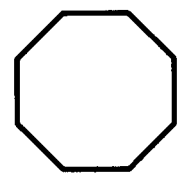
FIG. 13C is a diagram showing a regular octagon as a further example of the shape of the conductive post according to the embodiment of the invention.

The shape of the conductive post 40 is not limited to a substantial cylinder, and is optional. For example, the shape of the end face of the conductive post 40 (end face on the first end portion 41a side or the second end portion 42a side), or the shape of the horizontal cross section (X-Y plane) of the first column portion 41 (particularly, first end portion 41*a*), the second column portion 42 (particularly, second end portion 42*a*) or the collar portion 43 of the conductive post 40 is not limited to a substantial circle (substantially complete round), and is optional. The shapes of those surfaces may be a substantially regular polygon such as a substantially regular tetragon, substantially regular hexagon or substantially regular octagon, as shown in FIGS. 13A, 13B and 13C. In addition, those surfaces may have a substantially U shape, substantially L shape, substantially V shape or the like. The shape of the corner of the substantially polygonal shape, substantially U shape, substantially L shape, substantially V shape or the like is optional, and may have substantially the right angle, an acute angle, or an obtuse angle, or may be rounded. It is however favorable that the corner may be rounded to prevent concentration of thermal stress.

Figure 14:
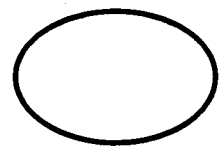
FIG. 14 is a diagram showing an ellipsis as a still further example of the shape of the conductive post according to the embodiment of the invention.

As shown in FIG. 14, the shapes of the surfaces may be a substantial ellipse. The shapes may also be a substantial rectangle, a substantial triangle or the like. However, those shapes are disadvantageous in that they are anisotropic.

The substantial circle, substantial ellipse and substantially regular polygon are advantageous in that they can easily become analogous to the shape of the hole 30*b*.

Figure 15A:
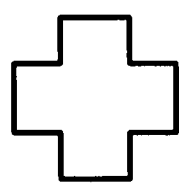
FIG. 15A is a diagram showing a cross shape as a yet still further example of the shape of the conductive post according to the embodiment of the invention.
Figure 15B:
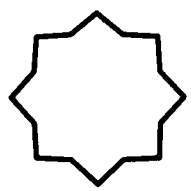
FIG. 15B is a diagram showing a regular polygonal star as a yet still further example of the shape of the conductive post according to the embodiment of the invention.
Figure 15C:
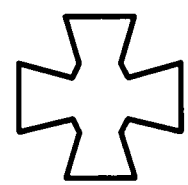
FIG. 15C is a diagram showing a cosmos shape as a yet still further example of the shape of the conductive post according to the embodiment of the invention.

Further, as shown in FIGS. 15A to 15C, shapes each having radially straight lines from the center (shapes having a plurality of blades arranged radially), such as a substantially cross shape (see FIG. 15A, for example), a substantially regular polygonal star (see FIG. 15B, for example), and a substantially cosmos shape (see FIG. 15C, for example), are effective as the shapes of the individual surfaces. The conductive post 40 which has such a shape is favorable to be inserted into the hole 30*b* when the hole 30*b* has a simple shape such as a substantially cylindrical shape.

In addition, shapes obtained by combination (complex shape) of the aforementioned shapes may be used. Further, one of those shapes may be matched with the opening shape of the hole 30*b*. The end face shape of the first end portion 41*a* may be analogous or non-analogous to the opening shape of the hole 30*b*. It is therefore possible to combine arbitrary shapes which may be selected, for example, from the shapes shown in FIGS. 13A to 15C to obtain the shape of each of the aforementioned surfaces.

It is to be noted that when the end face shape of the first end portion 41*a* is non-analogous to the opening shape of the hole 30*b*, the width of the first end portion 41*a* before the insertion is preferably greater than the width of the corresponding portion of the hole 30*b* by about 1% to about 75% of the thickness of the conductor 33 (d in FIG. 3), as mentioned above, and more preferably by about 5% to about 75% of the thickness of the conductor 33. In case of non-analogous shapes, at least a part of the first end portion 41*a* is fixed, and there is a part in the peripheral surface of the conductive post 40 which does not contact the conductor 33, making deformation of the conductive post 40 easier while making it difficult to secure the fitting area (area of fixture). The thickness of about 5% or greater makes it easy to secure a sufficient area of fixture. In this respect, the aforementioned range of about 5% to about 75% is more preferable in case of non-analogous shapes.

It is preferable that the fixture surface F1 between the first end portion 41*a* and the hole 30*b* should include two or more surfaces of substantially the same areas, which are arranged approximately symmetrical. In this case, the fixture surfaces F1 made to have substantially the same areas can make it easy to set the electrical resistances the same, and the approximate symmetrical arrangement of the fixture surfaces F1 can make it easy to uniformly disperse generated heat to be uniformly dispersed to the connection portions. As a result, the intensive temperature rise can be relaxed easily.

Figure 16A:
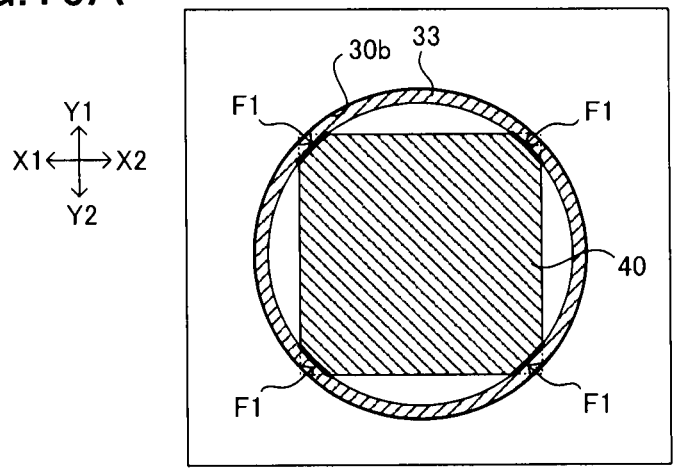
FIG. 16A is a cross-sectional view showing the connection structure for a conductive post with a regular tetragon and the wall surface of a circular hole according to the embodiment of the invention.
Figure 16B:
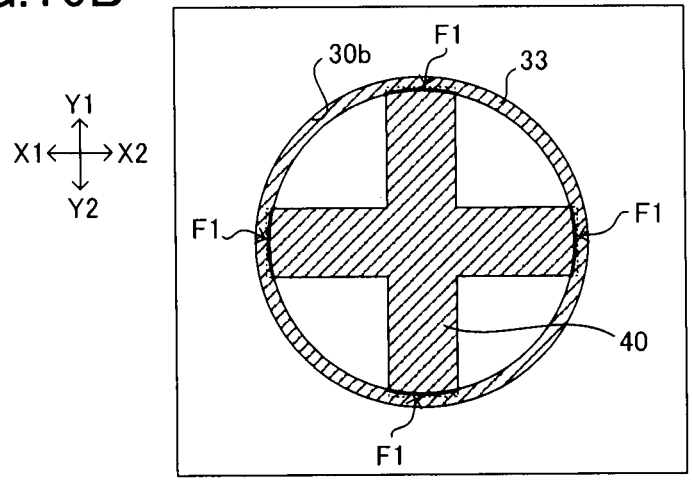
FIG. 16B is a cross-sectional view showing the connection structure for a conductive post with a cross shape and the wall surface of a circular hole according to the embodiment of the invention.
Figure 16C:
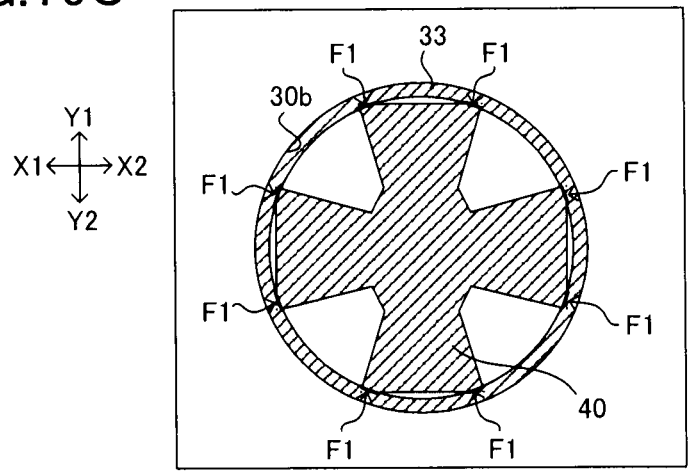
FIG. 16C is a cross-sectional view showing the connection structure for a conductive post with a cosmos shape and the wall surface of a circular hole according to the embodiment of the invention.
Figure 17A:
FIG. 17A is a diagram showing a straight shape as a yet still further example of the shape of the conductive post according to the embodiment of the invention.
Figure 17B:
FIG. 17B is a diagram showing a tapered shape as a yet still further example of the shape of the conductive post according to the embodiment of the invention.
Figure 17C:
FIG. 17C is a diagram showing a barrel shape as a yet still further example of the shape of the conductive post according to the embodiment of the invention.
Figure 17D:
FIG. 17D is a diagram showing a tympany shape as a yet still further example of the shape of the conductive post according to the embodiment of the invention.

FIGS. 16A to 16C show the connection portions of the conductive post 40 to the hole 30*b* when the opening shape of the hole 30*b* is, for example, a circle. When the first end portion 41*a* whose end face shape is a regular tetragon is fitted into the hole 30*b*, four fixture surfaces F1 of substantially the same areas are formed, and are arranged approximately symmetrical with respect to the axis of the conductive post 40 as shown in FIG. 16A. When the end face shape of the first end portion 41*a* is a substantially cross shape or a substantially cosmos shape, similar fixture surfaces F1 are obtained. In case of the cosmos shape shown in FIG. 16C, however, there are eight fixture surfaces F1.

The shape of the vertical cross section (X-Z plane or Y-Z plane) of the conductive post 40 is not limited to a stepped shape (see FIG. 3, for example), and is optional. As shown in FIGS. 17A to 17D, this shape may be a substantially straight shape (see FIG. 17A, for example), a substantially tapered shape (see FIG. 17B, for example), or a substantially barrel shape (see FIG. 17C, for example), or a substantially tympany shape (see FIG. 17D, for example).

Figure 18:
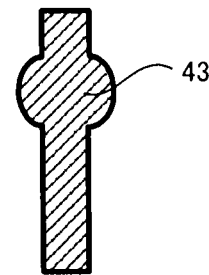
FIG. 18 is a diagram showing another example of the shape of the collar portion of a stepped post according to the embodiment of the invention.
Figure 19:
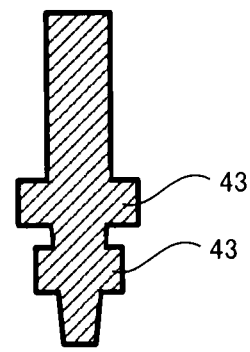
FIG. 19 is a diagram showing one example of a conductive post having a plurality of collar portions according to the embodiment of the invention.

The shape of the collar portion 43 is optional too; for example, it may be substantially spherical as shown in FIG. 18. The number of the collar portions 43 is also optional. As shown in FIG. 19, for example, the collar portions 43 (projections) may be provided on the side surface (peripheral surface) of the conductive post 40 at a plurality of locations (e.g., two locations).

Figure 20:
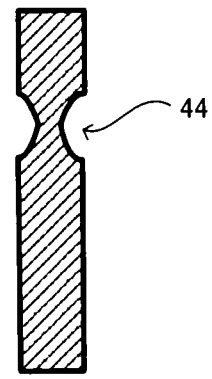
FIG. 20 is a diagram showing one example of a conductive post having a dent according to the embodiment of the invention.

A dent 44 (recess) may be provided on the side surface (peripheral surface) of the conductive post 40 as shown in FIG. 20, for example. The shape of the dent 44, the number thereof, etc. are optional.

Figure 21A:
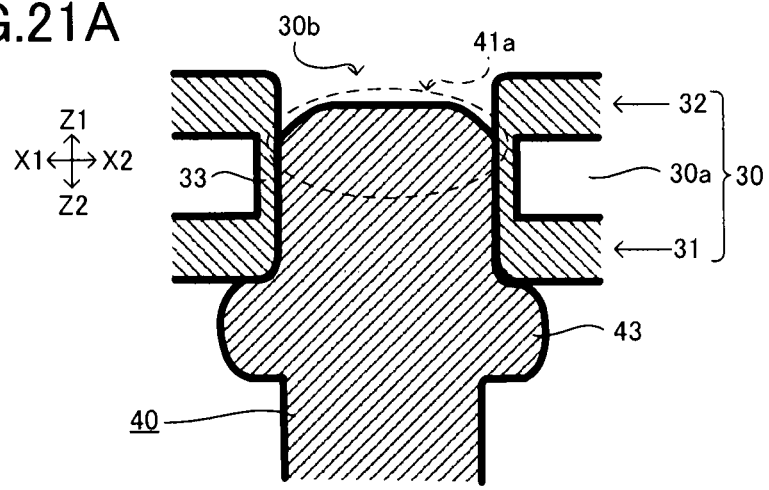
FIG. 21A is a diagram showing one example where a conductive post is fixed staying in a hole according to the embodiment of the invention.
Figure 21B:
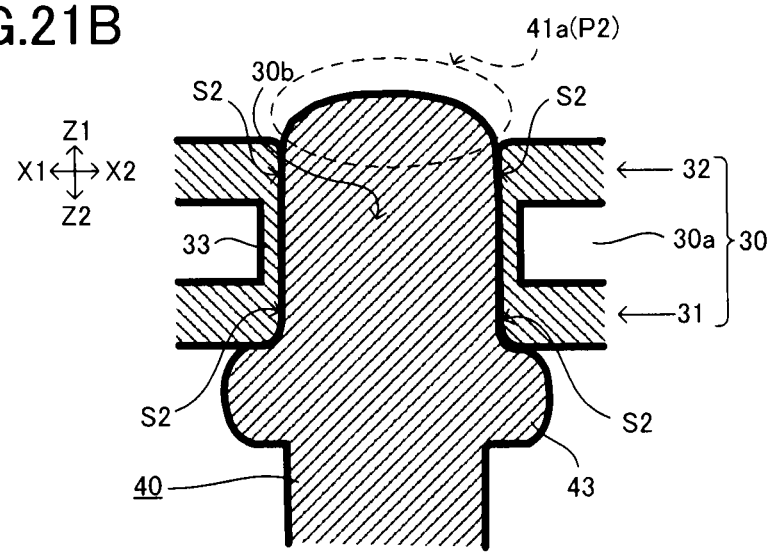
FIG. 21B is a diagram showing one example where a conductive is fixed penetrating through a hole according to the embodiment of the invention.
Figure 21C:
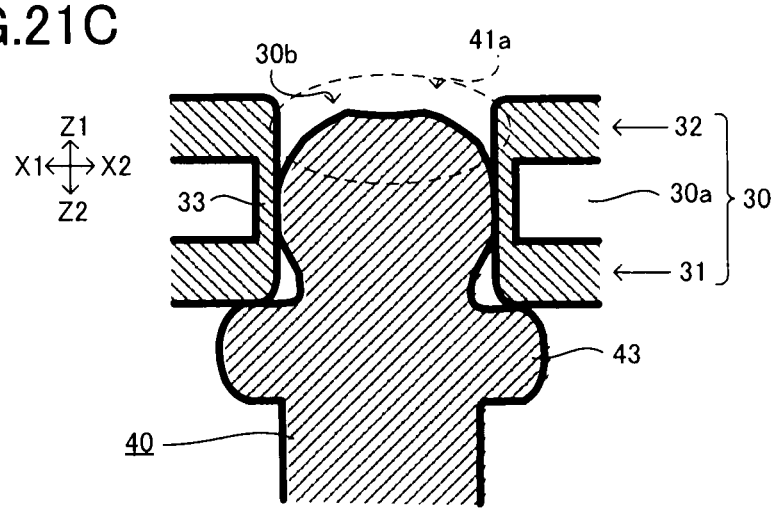
FIG. 21C is a diagram showing one example where the curved surface of a conductive is fixed to the wall surface of a hole according to the embodiment of the invention.

The conductive post 40 to be fitted into the hole 30*b* may stay in the hole 30*b* as shown in FIG. 21A, or may penetrate through the hole 30*b* as shown in FIG. 21B. The side surface of the conductive post 40, which is curved, may be fixed to the wall surface (conductor 33) of the hole 30*b* as shown in FIG. 21C.

Figure 22A:
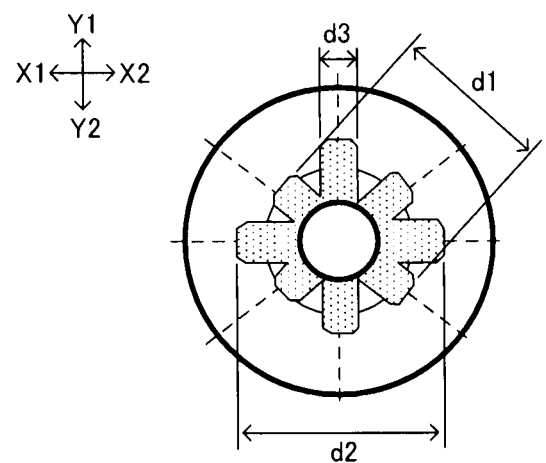
FIG. 22A is a plan view showing a more practical structure of a conductive post according to the embodiment of the invention.
Figure 22B:
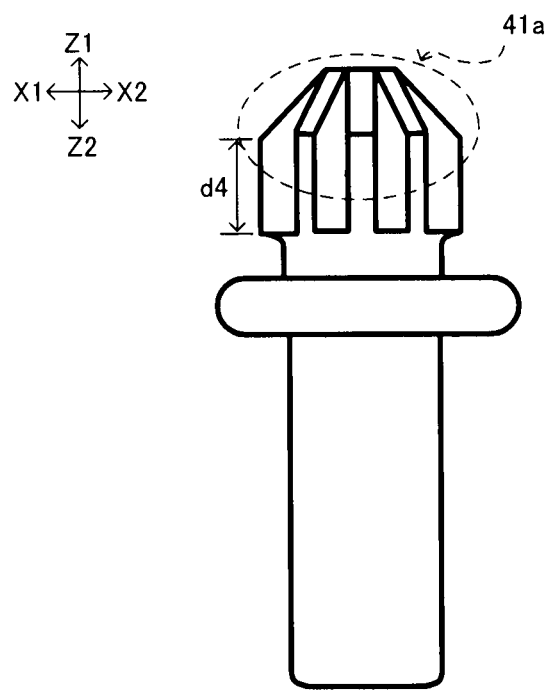
FIG. 22B is a side view showing the more practical structure of the conductive post according to the embodiment of the invention.

Although the shapes of the conductive post 40 are exemplarily illustrated in FIG. 3 and some other diagrams, it is actually preferable to precisely design the shape of the conductive post 40 in accordance with the use or the like as shown in FIG. 22A (plan view) and FIG. 22B (side view). To reduce the weight and the materials, it is preferable to make the volume of the conductive post 40 smaller as much as possible by cutting off an unnecessary portion or boring a hole. The details of the shapes shown in FIGS. 22A and 22B will be given in the later description of the Example 2.

The structure of the semiconductor device 101, 102, the types, performances, sizes, materials or the arrangement of the components thereof, the number of layers thereof, or the like can be changed arbitrarily without departing from the scope and spirit of the invention.

The fabrication method according to the invention is not limited to the contents and the order of the steps illustrated in the flowchart of FIG. 6, which can be changed arbitrarily without departing from the scope and spirit of the invention. Unnecessary steps may be eliminated according to the use or the like.

Example 1

The semiconductor device 102 (see FIGS. 8 and 9) according to the Example 1 will be described below. Same reference numerals are given to those components in this example which are the same as the corresponding components of the embodiment described above, and more detailed parameters will be presented for the individual components.

The semiconductor element 10 is an IGBT chip with a thickness of 0.09 mm and a size of 8×8 mm. The semiconductor element 10 has the external connection terminals 61 to 64 as external electrodes. The external connection terminal 61 is a collector electrode with a size of 10×1 mm and a length of 40 mm. The external connection terminal 62 is a gate electrode with a diameter of 1 mm and a length of 29 mm. The external connection terminal 63 is an electrode for various sensors, which has a diameter of 1 mm and a length of 29 mm. The external connection terminal 64 is an emitter electrode with a size of 10×1 mm and a length of 29 mm.

The semiconductor element 10a is an FWD chip with a thickness of 0.09 mm and a size of 2×2 mm. The electrodes 11a, 12a are the electrodes of the FWD chip.

The heat discharge plate 20 is made of AlN (aluminum nitride). Specifically, the heat discharge plate 20 is made of AlN ceramics with a thickness of 0.64 mm and a size of 14×12 mm. The electrode 21 which is adhered to one side of the heat discharge plate 20 has a thickness of 0.3 mm and a size of 12×10 mm, and includes a copper plate (C1940) containing "Fe: 0.85%, Zn: 0.12% and P: 0.03%".

The connecting board 50 has the support plate 30 and the conductive posts 40. The support plate 30 is a patchboard with a thickness of 0.47 mm and a size of 14×12 mm. The shape of the conductive post 40 differs from the shapes shown in FIGS. 8 and 9 (see FIG. 25).

The support plate 30 is fabricated in the following procedures. The procedures are equivalent to steps S11 and S12 in FIG. 6.

Figure 23A:
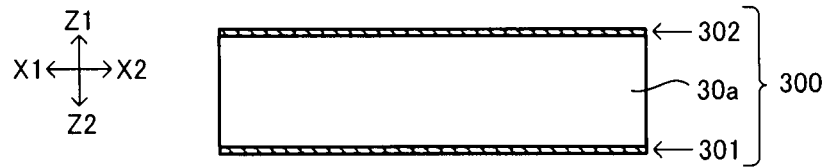
FIG. 23A is a diagram for explaining a first step of a method of fabricating a support plate according to an Example 1.

First, as shown in FIG. 23A, the starting material for the support plate 30 (hereinafter called starting substrate 300) is prepared. The starting substrate 300 is an HL679 FGS substrate (produced by Hitachi Chemical). The starting substrate 300 includes an insulating substrate 30a, and copper foils 301, 302 respectively laminated on both sides of the insulating substrate 30a. The thickness of the insulating substrate 30a is 0.2 mm, and the thickness of the copper foil 301, 302 is 0.105 mm.

Figure 23B:
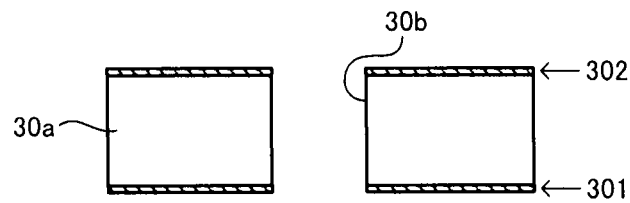
FIG. 23B is a diagram for explaining a second step following the step in FIG. 23A.

Subsequently, as shown in FIG. 23B, the holes 30b with a diameter of 0.5 mm are formed (bored) in the starting substrate 300 with a drill. The holes 30b are through holes. The holes 30b are formed facing the electrodes 12 to 14, and 12a (pad) respectively. The numbers of the holes 30b facing the individual electrodes are two the gate electrode, one for the sensor electrode, and fifteen (3×5) for the emitter electrode for the electrodes 12 to 14 of the semiconductor element 10, and four (2×2) for the electrode 12a of the semiconductor element 10a. The holes 30b are arranged in the centers of the electrodes 12 to 14 and 12a at pitches of 1 mm.

Figure 23C:
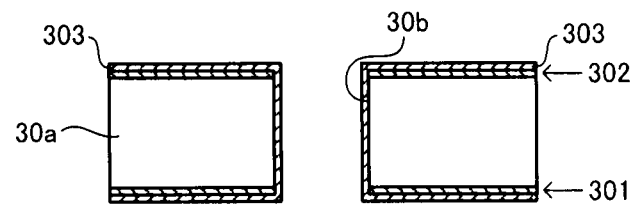
FIG. 23C is a diagram for explaining a third step following the step in FIG. 23B.

Subsequently, as shown in FIG. 23C, a chemical copper plated film 303 with a thickness of 0.1 μm is formed on the entire surface of the substrate by chemical copper plating (product of Uemura Plating Co.)

Figure 23D:
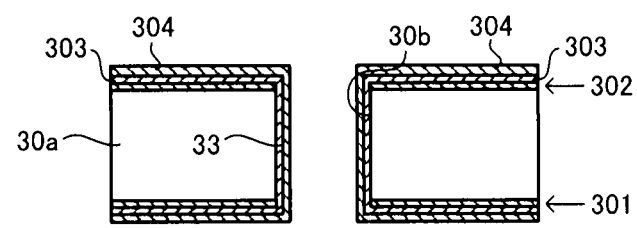
FIG. 23D is a diagram for explaining a fourth step following the step in FIG. 23C.

Subsequently, as shown in FIG. 23D, an electroless copper plated film 304 with a thickness of 30 μm is formed on the entire surface of the substrate by electroless copper plating (product of Okuno Chemical Industries Co., Ltd.). Accordingly, a conductive layer containing three layers of the copper foil 301 or 302, the chemical copper plated film 303 and the electroless copper plated film 304 is formed on both sides of the substrate, and the conductor 33 (copper plated film) is formed in each hole 30b.

Figure 23E:
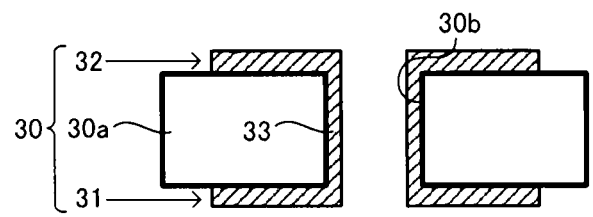
FIG. 23E is a diagram for explaining a fifth step following the step in FIG. 23D.

Subsequently, as shown in FIG. 23E, the conductor circuits 31, 32 are formed by patterning the conductive layers formed on both sides of the formed substrate. Specifically, a photo-sensitive dry film is laminated on both of the plated sides of the substrate, and is patterned by photolithography. As a result, dry films laid out and having sizes in association with the electrodes of the semiconductor elements 10 and 10a are formed. Thereafter, the conductive layers with the dry films remaining thereon are etched to form the conductor circuits 31, 32.

Then, the substrate with the conductor circuits 31, 32 formed thereon is cut to a size of 14×12 mm with a dicing saw (produced by Tokyo Seimitsu Co., Ltd.). As a result, the support plate 30 with a thickness of 0.47 mm is obtained.

The conductive posts 40 are inserted in the holes 30b of the support plate 30 as follows. This procedure is equivalent to step S13 in FIG. 6.

Figure 24A:
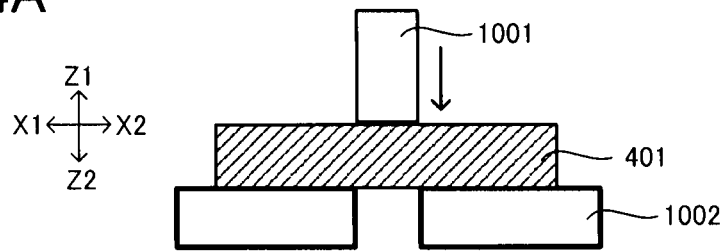
FIG. 24A is a diagram for explaining a first step of a method of inserting a conductive post into the hole of the support plate in the Example 1.

First, as shown in FIG. 24A, a copper plate 401 with a thickness of 0.8 mm is set in a mold (die punch 1001, die 1002). The copper plate 401 is made of oxygen-free copper C1020 (produced by Mitsubishi Shindoh Co., Ltd.) The die punch 1001 has a diameter of 0.45 mm.

Figure 24B:
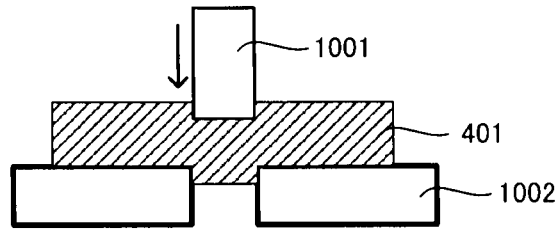
FIG. 24B is a diagram for explaining a second step following the step in FIG. 24A.

Subsequently, as shown in FIG. 24B, the copper plate 401 is punched to protrude by 0.05 mm using the die punch 1001.

Figure 24C:
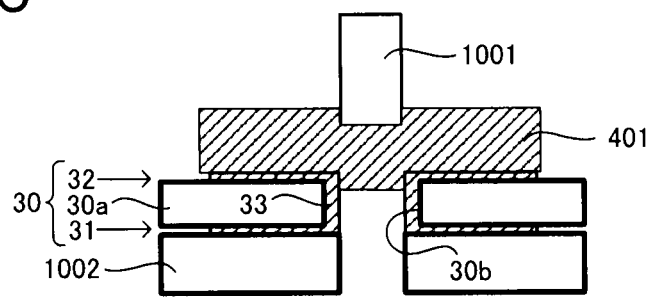
FIG. 24C is a diagram for explaining a third step following the step in FIG. 24B.

Subsequently, as shown in FIG. 24C, the protruding portion of the copper plate 401 is placed to face the hole 30b of the support plate 30, and both are set in close contact with each other.

Figure 24D:
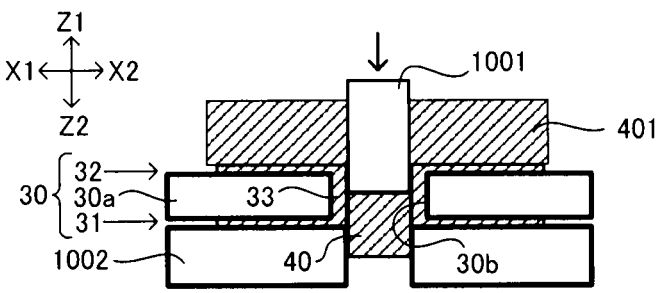
FIG. 24D is a diagram for explaining a fourth step following the step in FIG. 24C.
Figure 24E:
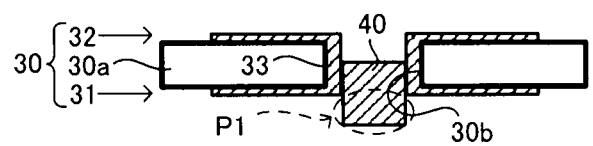
FIG. 24E is a diagram for explaining a fifth step following the step in FIG. 24D.

Subsequently, as shown in FIG. 24D, the copper plate 401 is driven into the hole 30b using the die punch 1001. As a result, the conductive post 40 penetrates through the hole 30b and protrudes therefrom on the opposite side (on the arrow Z2 side) by about 0.6 mm. The individual parameters of the protruding portion (projection P1 in the diagram) of the conductive post 40 are an average diameter of 0.44 mm, an average protrusion amount of 0.595 mm, and an aspect ratio of 1.352.

Figure 25:
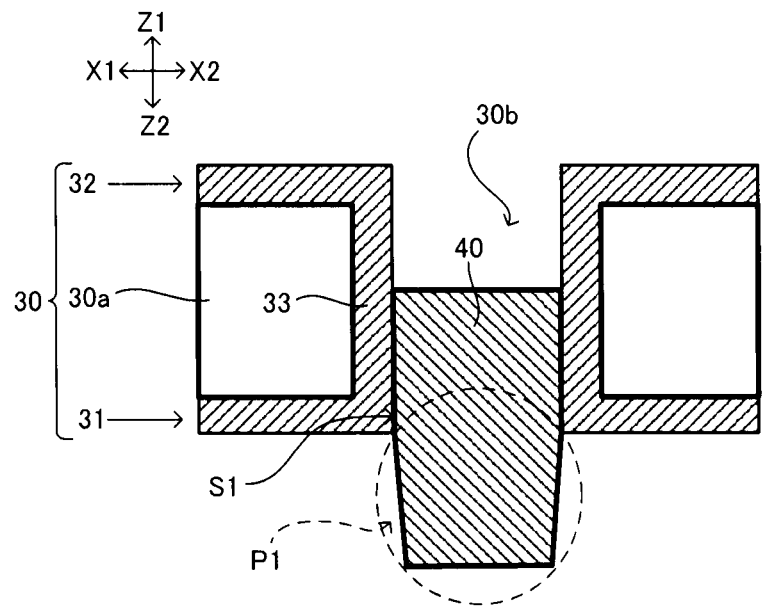
FIG. 25 is a diagram showing the conductive post according to the Example 1 being connected to the support plate.

According to this example, the conductive post 40 is inserted (fitted) into the hole 30b of the support plate 30 from the second end portion 42a side. Accordingly, the wall surface of the hole 30b (more specifically, the conductor 33) is deformed by the pressing force from the conductive post 40 applied thereto. As a result, the conductive post 40 is fixed in a state fitted with the conductor 33. The fitting area (area where the conductive post 40 is fixed to the conductor 33 on the wall surface of the hole 30b) was 0.283 mm$^2$. As shown in FIG. 25, a side surface S1 (peripheral surface) of the conductive post 40 contacts the side surface of the conductor circuit 31 substantially entirely.

The conductive posts 40 are inserted (fitted) into all the holes 30b respectively in this manner. As a result, the coplanarity of the conductive post 40 was 0.028 mm. The coplanarity is that the of terminals of parts or the like are arranged in the same plane (uniformity).

Subsequently, sparkle flux WF-6400 (produced by Senju Metal Industry Co., Ltd.) and ECO solder ball S M705 (produced by Senju Metal Industry Co., Ltd.) are fitted in the clearance between the support plate 30 and the conductive post 40 in the hole 30b. The ECO solder ball S M705 is a Pb-free solder ball having a diameter of 0.45 mm and containing 3% of Ag and 0.5% of Cu.

Then, the support plate 30 is fed to a reflow furnace under the $N_2$ environment at a speed of 60 mm/min to solder the wall surface of the hole 30b with the conductive post 40. This reinforces the connection of the support plate 30 with the conductive post 40. As a result, the connecting board 50 is produced. When the solder melts, the maximum allowable temperature set by heating is 280° C. The time for which heating at 240° C. or higher is 35 minutes. Then, after the temperature is set back to the room temperature, the soldered substrate is removed from the reflow furnace at a cooling speed of 5° C./min.

The semiconductor elements 10 and 10a are mounted on (connected to) the heat discharge plate 20 as follows. This procedure is equivalent to step S14 in FIG. 6.

The electrode 11 of the semiconductor element 10 and the electrode 11a of the semiconductor element 10a are connected to the electrode 21 of the heat discharge plate 20 by the conductive material 71a, 71c. The conductive material 71a, 71c is an Sn solder containing 3% of Ag and 0.5% of Cu. The semiconductor elements 10 and 10a are soldered in the reflow furnace under the $N_2$ environment by the conductive materials 71a, 71c. When the solder melts, the maximum allowable temperature set by heating is 260° C. The time for which heating at 240° C. or higher is 90 seconds.

The semiconductor elements 10 and 10a are mounted on (connected to) the connecting board 50 as follows. This procedure is equivalent to step S15 in FIG. 6.

After the semiconductor elements 10 and 10a are mounted on the heat discharge plate 20, the conductive materials 72a to 72d with a thickness of 30 μm are printed on the electrodes 12 to 14 of the semiconductor element 10 and the electrode 12a of the semiconductor element 10a. The conductive materials 72a to 72d include a solder paste S70G (produced by Senju Metal Industry Co., Ltd.), which is an Sn solder containing 3% of Ag and 0.5% of Cu.

Subsequently, the conductive posts 40 are set facing the respective electrodes of the semiconductor elements 10 and 10a.

Then, the support plate 30 is fed to an $H_2$ reflow furnace (produced by Denko Co., Ltd.) at a speed of 120 mm/min to solder the individual electrodes of the semiconductor elements 10 and 10a to the conductive posts 40. When the solder melts, the maximum allowable temperature set by heating is 350° C. The time for which heating at 270° C. or higher is 25 minutes. Then, the soldered substrate is removed from the reflow furnace at a cooling speed of 100° C./min.

According to this method, solder fillets are formed at the conductive materials 72a to 72d for connecting the conductive posts 40. The solder (conductive materials 72a to 72d) rises up to the height of 0.2 mm.

The individual electrodes of the semiconductor elements 10 and 10a and the conductive posts 40 are connected together at a time (connected collectively) by the foregoing method. Thereafter, the external connection terminals 61 to 65 are connected by according to the foregoing soldering to complete the semiconductor device 102.

The semiconductor device 102 of the Example 1 can make it easy to let a large current flow as follows.

To measure the allowable current of the semiconductor device 102, the present inventor caused the current to flow to the electrode 14 (emitter electrode) of the semiconductor element 10 at room temperature of 25° C. while cooling the bottom side of the heat discharge plate 20 with water of 50° C. at a speed of 0.5 m/min, and measured the current when the temperature of the semiconductor element 10 became 150° C. As a result, a current of 63 A per single conductive post or 945 A in total could be allowed to flow for fifteen conductive posts 40 included in the emitter posts E.

Example 2

The semiconductor device 101 (see FIGS. 1 and 2) according to the Example 2 will be described below. Same reference numerals are given to those components in this example which are the same as the corresponding components of the embodiment described above, and more detailed parameters will be presented for the individual components.

The semiconductor element 10 is an IGBT chip, and the heat discharge plate 20 is an AlN heat discharge plate as in the Example 1.

The fabrication method for the support plate 30 will be described referring to FIGS. 26A and 26B in addition to FIGS. 23A to 23E described previously.

First, as shown in FIG. 23A, the starting material for the support plate 30 (hereinafter called starting substrate 300) is prepared. The starting substrate 300 is an UPILEX (registered trademark; Ube Aerospace Materials). The starting substrate 300 includes an insulating substrate 30a, and copper foils 301, 302 respectively laminated on both sides of the insulating substrate 30a. The insulating substrate 30a is a polyimide substrate. The thickness of the insulating substrate 30a is 0.05 mm, and the thickness of the copper foil 301, 302 is 0.17 mm.

Subsequently, as shown in FIG. 23B, the holes 30b with a diameter of 0.6 mm are formed (bored) in the starting substrate 300 with a carbon dioxide laser. The holes 30b are through holes. The holes 30b are formed facing the electrodes 12 to 14, respectively. The numbers of the holes 30b facing the individual electrodes are the same as those of the Example 1.

Subsequently, as shown in FIG. 23C, a chemical copper plated film 303 with a thickness of 0.1 μm is formed on the entire surface of the substrate by chemical copper plating (product of Uemura Plating Co.).

Subsequently, as shown in FIG. 23D, an electroless copper plated film 304 with a thickness of 40 μm is formed on the entire surface of the substrate by electroless copper plating (product of Okuno Chemical Industries Co., Ltd.). Accordingly, a conductive layer containing three layers of the copper foil 301, 302, the chemical copper plated film 303 and the electroless copper plated film 304 is formed on both sides of the substrate, and the conductor 33 (copper plated film) is formed in each hole 30b.

Subsequently, as shown in FIG. 23E, the conductor circuits 31, 32 are formed by patterning the conductive layers formed on both sides of the formed substrate as in the Example 1.

Figure 26A:
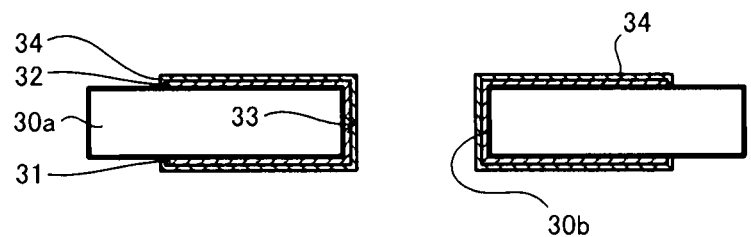
FIG. 26A is a diagram for explaining a first step of a method of coating the surface of a conductor circuit according to an Example 2.
Figure 26B:
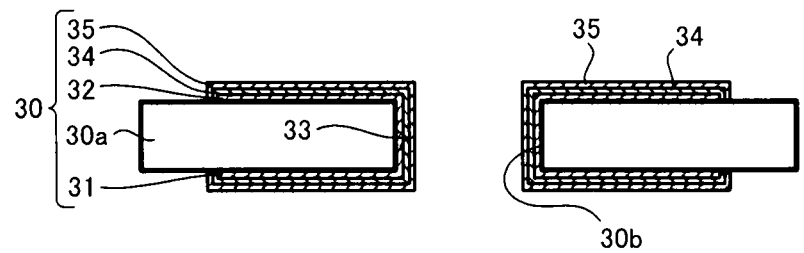
FIG. 26B is a diagram for explaining a second step following the step in FIG. 26A.

According to this example, subsequently, an electroless nickel film 34 having a thickness of 5 μm and containing 1% of boron is formed on the surface of the conductor circuit 31, 32 as shown in FIG. 26A. Then, an electroless gold plated film 35 having a thickness of 0.15 μm is formed on the electroless nickel film 34 by gold plating as shown in FIG. 26B. As a result, a two-layer coating film having the electroless nickel film 34 and the electroless gold plated film 35 is formed.

Then, the substrate with the coating film formed thereon is cut to a size of 14×12 mm with a dicing saw (produced by Tokyo Seimitsu Co., Ltd.). As a result, the support plate 30 with a thickness of 0.45 mm is obtained.

The conductive post 40 is produced as follows. The surface of the conductive post 40 according to this example is coated (see FIG. 10).

First, a copper wire with a diameter of 0.45 mm is prepared. The copper wire is made of oxygen-free copper C1020 (produced by Mitsubishi Shindoh Co., Ltd.) The copper wire is drawn using a mold into a shape as shown in FIGS. 22A and 22B. As a result, the columnar conductor 40a of copper is formed.

Then, like the coating film on the surface of the conductor circuit 31, 32, a coating film 40b is formed on the surface of the columnar conductor 40a. That is, the coating film 40b contains two layers, namely, an electroless nickel film and an electroless gold plated film. As a result, the conductive post 40 is completed.

The conductive post 40 obtained this way has a shape as shown in FIGS. 22A and 22B. The end face shape (X-Y plane) of the first end portion 41a of the conductive post 40, particularly, the portion thereof which is fitted in the hole 30b (hereinafter referred to as "fitting portion") is a a cosmos shape. The short side of the cosmos shape has a width (d1 in FIG. 22A) of 0.54 mm, and the long side thereof has a width (d2 in FIG. 22A) of 0.57 mm. The fitting portion has eight valves (small pieces) each having a width (d3 in FIG. 22A) of 0.14 mm. The fitting portion has a thickness (d4 in FIG. 22A) of 0.25 mm. The shape of the horizontal cross section of the collar portion 43 is a circle with a diameter of 0.75 mm.

The conductive posts 40 are inserted in the holes 30b of the support plate 30 as follows.

First, the conductive post 40 is placed to face the hole 30b of the support plate 30, and both are set in close contact with each other. Subsequently, the fitting portion of the conductive post 40 is driven into the hole 30b with the force of 35 N/post. As a result, the conductive post 40 penetrates through the hole 30b and protrudes therefrom on the opposite side (on the arrow Z1 side) by about 0.8 mm. The individual parameters of the protruding portion (projection P2 in FIG. 21B) of the conductive post 40 are an average diameter of 0.45 mm, an average protrusion amount of 0.802 mm, and an aspect ratio of 1.34.

According to this example, the conductive post 40 is inserted (fitted) into the hole 30b of the support plate 30 from the first end portion 41a side. Accordingly, the wall surface of the hole 30b (more specifically, the conductor 33) is deformed by the pressing force from the conductive post 40 applied thereto. As a result, the conductive post 40 is fixed in a state fitted with the conductor 33. The fitting area (area of fixture) was 0.308 mm$^2$. A side surface S2 (peripheral surface) of the conductive post 40 contacts the side surfaces of the conductor circuits 31 and 32 substantially entirely. The area of contact was 0.258 mm$^2$, which was equivalent to 37.4% of the side surface S2.

The conductive posts 40 are inserted (fitted) into all the holes 30b respectively in this manner. As a result, the coplanarity of the conductive post 40 was 0.013 mm.

Thereafter, each of the heat discharge plate 20 and the connecting board 50 is connected to the semiconductor element 10, and the external connection terminals 61 to 64 are connected by soldering to complete the semiconductor device 101.

The semiconductor device 101 of the Example 2 can make it easy to let a large current flow as follows.

The present inventor measured the allowable current of the semiconductor device 101 in the same way as done in the Example 1. The results of the measurement showed that a current of 57 A per single conductive post or 855 A in total could be allowed to flow for fifteen conductive posts 40 included in the emitter posts E.

Other Examples

Further, the allowable currents, etc. were measured for an example (Example 3) where the material for the conductive post 40 in the Example 1 was changed, and examples (Examples 4 and 5) where the amount of insertion of the conductive post 40 and the area of fixture thereof in the Example 1 were changed. the allowable currents, etc. were also measured for examples (Examples 6 and 7) where the size (fitting size) of the end face of the conductive post 40 in the Example 2 was changed, and an example (Example 8) where a solder ball was not used in connecting the conductive post 40 to the hole 30b. The conditions and the results are illustrated in FIGS. 27 to 30 along with the results on the foregoing Examples 1 and 2. In the diagrams, samples #11 to #18 are equivalent to semiconductor devices of the Examples 1 to 8, respectively. FIG. 27 shows the shapes, etc. of the hole 30b, and the conductor 33. FIG. 28 shows the materials, etc. of the conductive post 40. FIG. 29 shows the areas of fixture (fitting areas), etc. of the fixing portion. FIG. 30 shows the results of measuring the allowable current in the temperature range of 25° C. to 150° C.

The material for the conductive post 40 in the Example 3 (#13) is pure aluminum 1N99 (produced by Sumitomo Light Metal Industries, Ltd.). In the Examples 4 and 5 (#14 and #15), the area of fixtures are changed by setting the amount of insertion of the conductive post 40 to 0.3 mm and 0.7 mm, respectively. In the sample #17, as shown in FIG. 29, the area of fixture of the conductive post 40 and the wall surface (conductor 33) of the hole 30b is less than 50% of the horizontal cross section of the conductive post 40.

As shown in FIG. 30, the samples #11 to #16 (Examples 1 to 6) having an area of fixture equal to or greater than 50% of the area of the horizontal cross section of the conductive post 40 could provide a larger allowable current than the sample #17 (Example 7) having an area of fixture less than 50% of the area of the horizontal cross section of the conductive post 40. Further, the samples #11 to #14 (Examples 1 to 4) having an area of fixture equal to or greater than 100% of the area of the horizontal cross section of the conductive post 40 could provide a larger allowable current than the samples #15 to #17 (Examples 5 to 7) having an area of fixture less than 100% of the area of the horizontal cross section of the conductive post 40.

The sample #11 where the conductive posts 40 of copper were applied, when compared with the sample #13 where the conductive posts 40 of aluminum were applied, could provide a larger allowable current.

The sample #12 where a solder ball was used to connect the conductive posts 40 and the hole 30b together, when compared with the sample #18 where a solder ball was not used, could provide a larger allowable current.

The embodiment, and other examples can be combined.

Having described and illustrated the principles of this application by reference to one preferred embodiment and examples, it should be apparent that the preferred embodiment and examples may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor device comprising:
   a support plate having a hole formed therein and a conductor formed on a wall surface of the hole;
   a semiconductor element; and
   a conductive post formed by a conductor having a first end portion at one end, and a second end portion at an other end,
   wherein the second end portion of the conductive post is connected to the semiconductor element, a side surface of the conductive post is fixed to the conductor on the wall surface of the hole deformed by pressing force of the conductive post on a side closer to the first end portion than the second end portion, the conductive post has a columnar conductor and a coating film formed on a surface of the columnar conductor, the columnar conductor of the conductive post has a main component selected from the group consisting of copper, silver, gold and aluminum, and the coating film of the conductive post is a metal selected from the group consisting of chromium, nickel, palladium, titanium and platinum.

2. The semiconductor device according to claim 1, wherein an area of contact between the conductive post and the conductor on the wall surface of the hole is at least about 50% of an area of a horizontal cross section of the conductive post orthogonal to an axial direction thereof or greater.

3. The semiconductor device according to claim 1, wherein a conductive layer formed on at least one major surface of the support plate, and the side surface of the conductive post is in contact with the conductive layer on the major surface.

4. The semiconductor device according to claim 3, wherein an area of contact between the side surface of the conductive post and the conductive layer is at least about 15% of the area of the horizontal cross section of the conductive post orthogonal to the axial direction thereof or greater.

5. The semiconductor device according to claim 1, wherein a shape of an end face of the first end portion is non-analogous to an opening shape of the hole, and a fixing surface between the side surface of the conductive post and the conductor on the wall surface of the hole includes two or more surfaces with approximately same areas, which are arranged approximately symmetrically.

6. The semiconductor device according to claim 1, wherein the shape of the end face of the first end portion is a substantially complete round, a substantial ellipse, a substantial rectangle, a substantially regular polygon, a substantially regular polygon star, a substantially cosmos shape, a substantial cross, or a shape obtained by combining two or more thereof.

7. The semiconductor device according to claim 1, wherein the hole has a substantially cylindrical shape.

8. The semiconductor device according to claim 1, wherein the main component of the conductive post is copper.

9. The semiconductor device according to claim 1, wherein the coating film has a thickness of about 0.5 µm to about 10 µm.

10. The semiconductor device according to claim 1, further comprising:
a heat discharge plate having a conductive layer at least on a support plate side; and
at least one electrode of the semiconductor element is fixed to the conductive layer of the heat discharge plate.

11. The semiconductor device according to claim 10, wherein the heat discharge plate is one of an insulative ceramic plate, a heat-resistant resin plate, and an insulated metal plate.

12. The semiconductor device according to claim 10, wherein the at least one electrode of the semiconductor element is fixed to the conductive layer of the heat discharge plate by solder, a wax material or a conductive paste.

13. A fabrication method for a semiconductor device, comprising:
forming a hole in a support plate;
forming a conductor on a wall surface of the hole;
fitting the conductive post in the hole;
fixing a first end portion of the conductive post to the conductor on the wall surface of the hole; and
connecting a second end portion of the conductive post, which is on an opposite side to the first end portion, to the semiconductor element,
wherein a side surface of the conductive post is fixed to the conductor on the wall surface of the hole deformed by pressing force of the conductive cost on a side closer to the first end portion than the second end portion, the conductive post has a columnar conductor and a coating film formed on a surface of the columnar conductor, the columnar conductor of the conductive post has a main component selected from the group consisting of copper, silver, gold and aluminum, and the coating film of the conductive post is a metal selected from the group consisting of chromium, nickel, palladium, titanium and platinum.

14. The fabrication method according to claim 13, wherein a width of the first end portion of the conductive post before the fitting thereof is greater by about 1% to about 75% of a thickness of the conductor on the wall surface of the hole than a width of a corresponding portion of the hole.

15. The fabrication method according to claim 14, wherein a shape of an end face of the first end portion is analogous to an opening shape of the hole, and the width of the first end portion of the conductive post before the fitting thereof is greater by about 1% to about 50% of the thickness of the conductor on the wall surface of the hole than the width of the corresponding portion of the hole.

16. The fabrication method according to claim 14, wherein a shape of an end face of the first end portion is non-analogous to an opening shape of the hole, and the width of the first end portion of the conductive post before the fitting thereof is greater by about 5% to about 75% of the thickness of the conductor on the wall surface of the hole than the width of the corresponding portion of the hole.

17. The fabrication method according to claim 13, wherein the main component of the conductive post is copper.

18. The fabrication method according to claim 13, wherein the coating film is formed such that the coating film has a thickness of about 0.5 µm to about 10 µm.

19. The fabrication method according to claim 13, further comprising:
forming a heat discharge plate having a conductive layer at least on a support plate side; and
fixing at least one electrode of the semiconductor element to the conductive layer of the heat discharge plate.

20. The fabrication method according to claim 19, wherein the at least one electrode of the semiconductor element is fixed to the conductive layer of the heat discharge plate by solder, a wax material or a conductive paste.

* * * * *